(12) United States Patent
Lin

(10) Patent No.: US 12,490,562 B2
(45) Date of Patent: Dec. 2, 2025

(54) DISPLAY PANEL COMPRISING MULTIPLE PIXEL STRUCTURES INCLUDING REPAIRED PIXEL STRUCTURE

(71) Applicant: AUO Corporation, Hsinchu (TW)

(72) Inventor: Shih-Hsiung Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 423 days.

(21) Appl. No.: 18/088,774

(22) Filed: Dec. 27, 2022

(65) Prior Publication Data
US 2024/0178357 A1 May 30, 2024

(30) Foreign Application Priority Data

Nov. 29, 2022 (CN) .......................... 202211511699.9

(51) Int. Cl.
*H10H 20/857* (2025.01)
*H01L 23/00* (2006.01)
*H01L 25/16* (2023.01)

(52) U.S. Cl.
CPC .......... *H10H 20/857* (2025.01); *H01L 24/05* (2013.01); *H01L 24/24* (2013.01); *H01L 24/29* (2013.01); *H01L 24/82* (2013.01); *H01L 24/83* (2013.01); *H01L 24/92* (2013.01); *H01L 25/167* (2013.01); *H01L 24/06* (2013.01); *H01L 24/08* (2013.01); *H01L 24/25* (2013.01); *H01L 24/32* (2013.01); *H01L 24/73* (2013.01);
(Continued)

(58) Field of Classification Search
CPC ............... H01L 25/167; H01L 25/0753; H01L 2224/24051; H01L 2224/25174; H01L 2224/24145; H01L 2224/32145; H01L 24/83; H01L 24/32; H01L 24/29; H01L 2224/05573; H01L 24/25; H01L 24/24; H10H 20/0362; H10H 20/0364; H10H 20/857
USPC ............................................... 257/91; 438/22
See application file for complete search history.

(56) References Cited

U.S. PATENT DOCUMENTS 10,840,158 B2   11/2020   Guo et al.
2019/0172761 A1*  6/2019   Guo .................. H01L 22/22
(Continued)

FOREIGN PATENT DOCUMENTS

CN   108321169   6/2020
CN   112271175   1/2021
(Continued)

*Primary Examiner* — Didarul A Mazumder
(74) *Attorney, Agent, or Firm* — JCIPRNET

(57) ABSTRACT

A display panel includes a circuit substrate, pixel structures and a molding layer. The circuit substrate has first pad structures and second pad structures. The pixel structures are disposed above a display region of the circuit substrate. Each of at least a portion of the pixel structures includes a first light emitting diode, a first conductive block, and a first conductive connection structure. The first light emitting diode is disposed on a corresponding first pad structure. The first conductive block is disposed on a corresponding second pad structure. The first conductive connection structure electrically connects the first light emitting diode to the first conductive block. The molding layer is located above the circuit substrate and surrounds the first light emitting diode and the first conductive block. The first conductive connection structure is located on the molding layer.

14 Claims, 21 Drawing Sheets

(52) U.S. Cl.
CPC ............ *H01L 2224/05573* (2013.01); *H01L 2224/06132* (2013.01); *H01L 2224/08145* (2013.01); *H01L 2224/24051* (2013.01); *H01L 2224/24145* (2013.01); *H01L 2224/245* (2013.01); *H01L 2224/24991* (2013.01); *H01L 2224/25174* (2013.01); *H01L 2224/29016* (2013.01); *H01L 2224/2919* (2013.01); *H01L 2224/32145* (2013.01); *H01L 2224/73217* (2013.01); *H01L 2224/82007* (2013.01); *H01L 2224/83931* (2013.01); *H01L 2224/92144* (2013.01); *H01L 2924/0549* (2013.01)

(56) References Cited

U.S. PATENT DOCUMENTS

| | | | |
|---|---|---|---|
| 2019/0252312 A1* | 8/2019 | Yu | H01L 25/075 |
| 2019/0341306 A1* | 11/2019 | Yu | H01L 24/08 |
| 2020/0328196 A1 | 10/2020 | Han et al. | |
| 2021/0296547 A1 | 9/2021 | Wu et al. | |
| 2022/0045123 A1* | 2/2022 | Yang | H10H 20/857 |
| 2022/0359377 A1* | 11/2022 | Yu | H01L 24/82 |
| 2022/0399317 A1* | 12/2022 | Lee | H01L 25/13 |

FOREIGN PATENT DOCUMENTS

| | | |
|---|---|---|
| CN | 112786641 | 5/2021 |
| CN | 112928104 | 9/2022 |

* cited by examiner

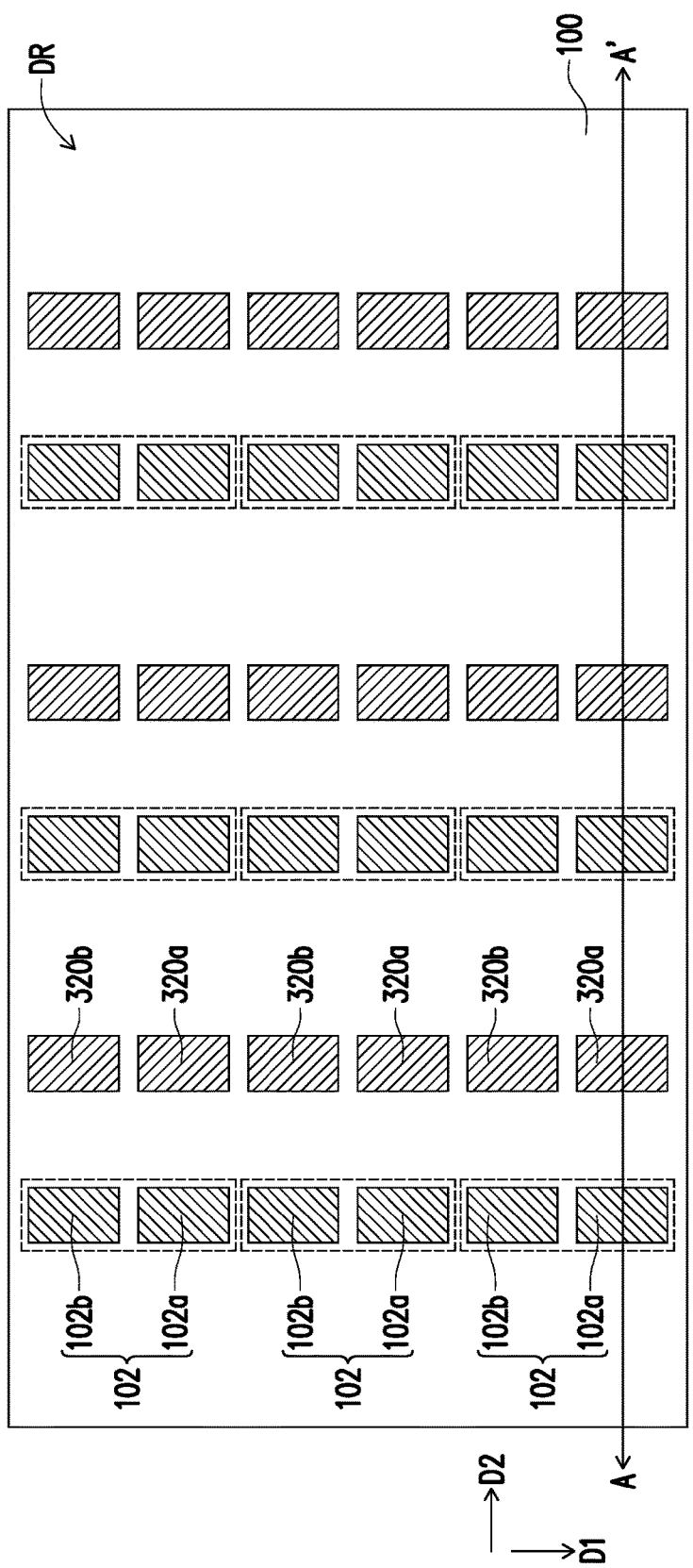
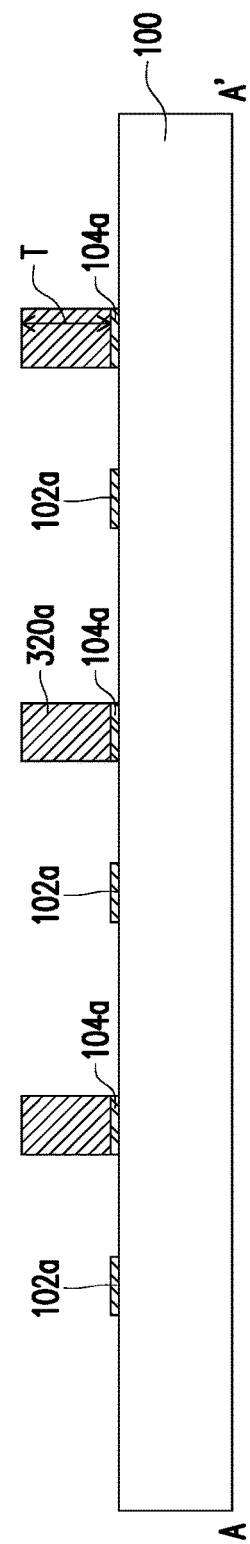
FIG. 2A
FIG. 2B

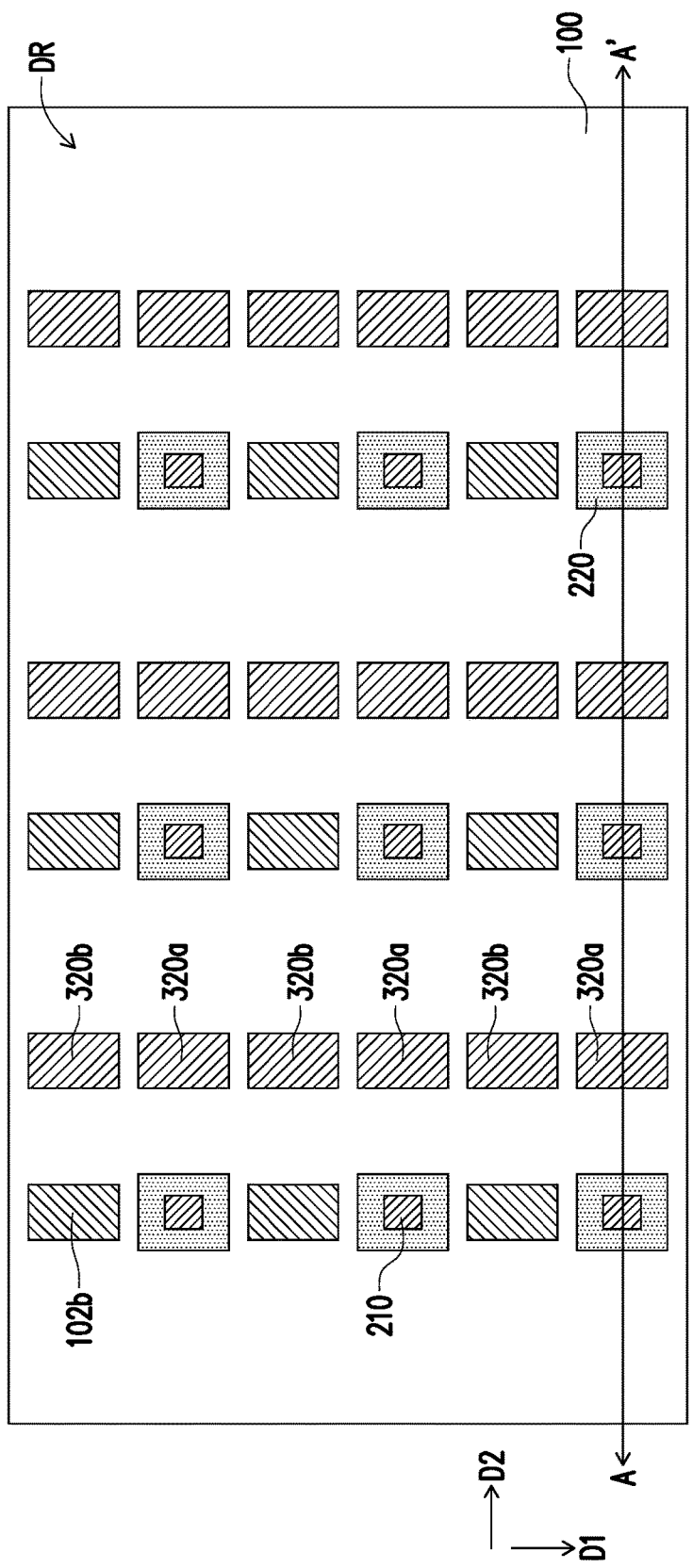
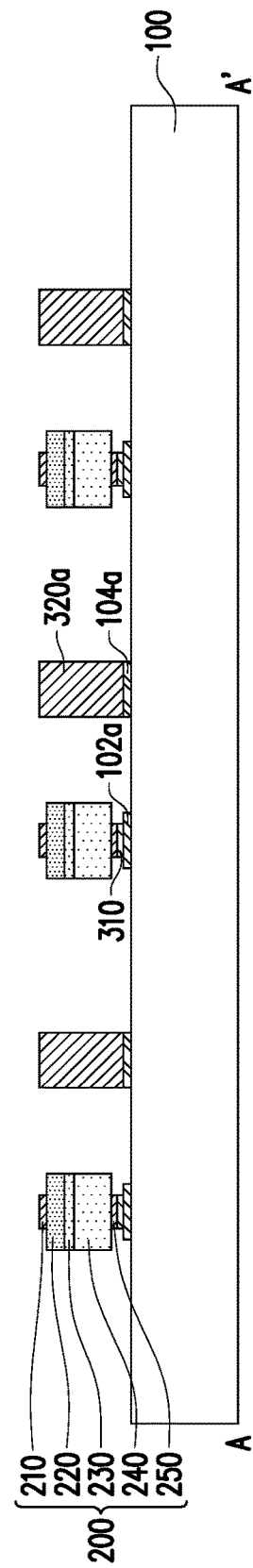
FIG. 3A
FIG. 3B

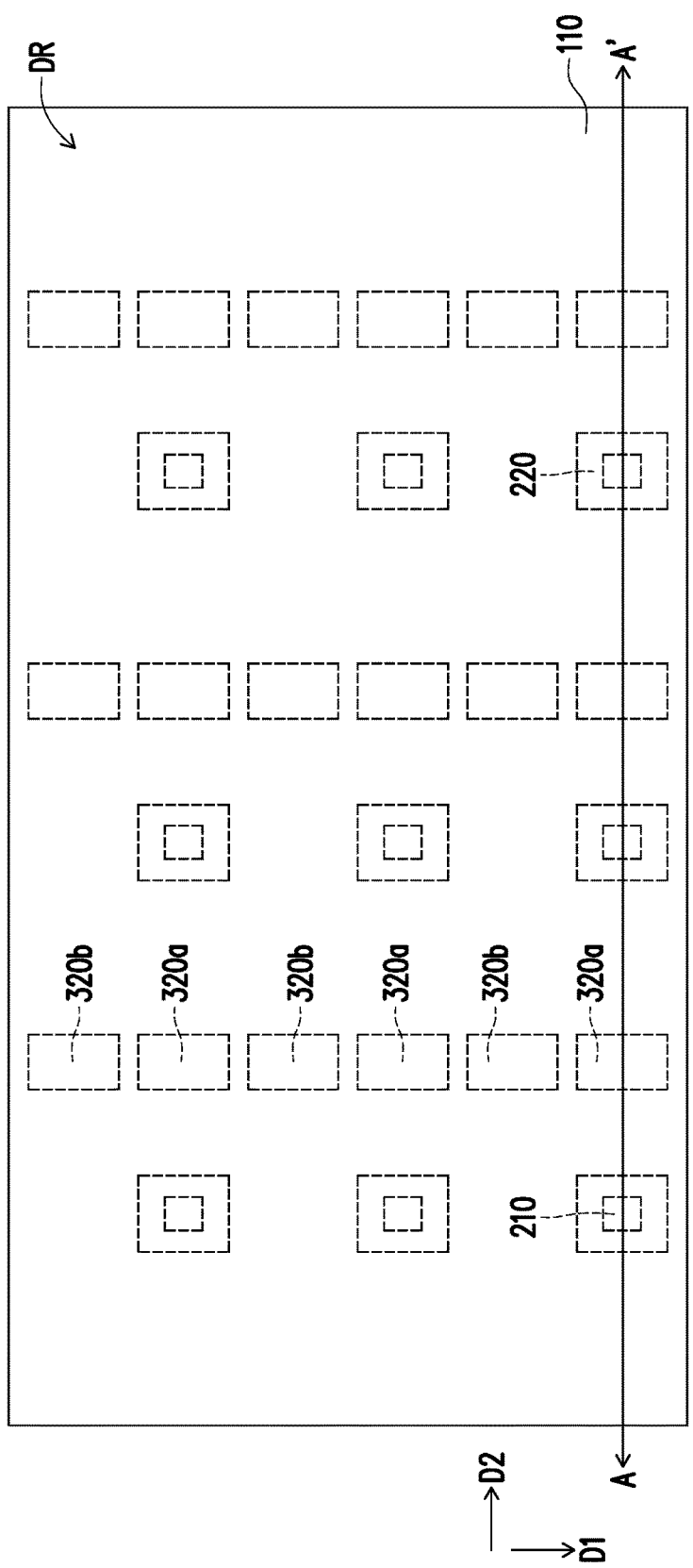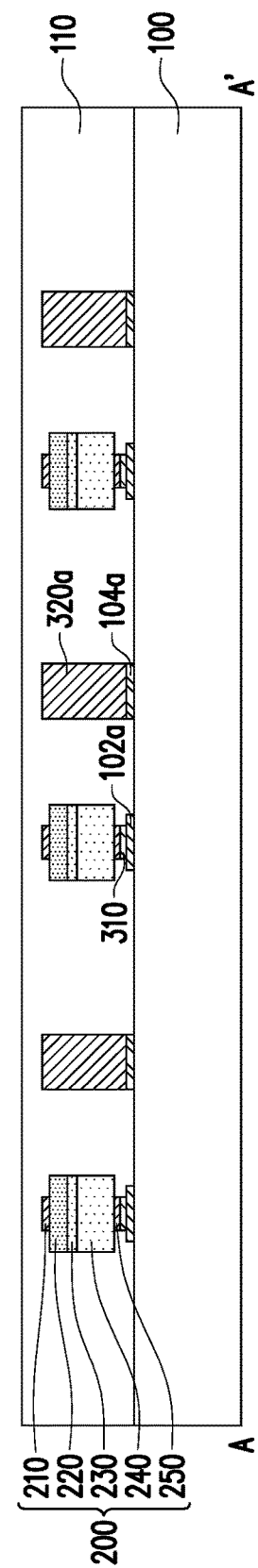
FIG. 4A
FIG. 4B

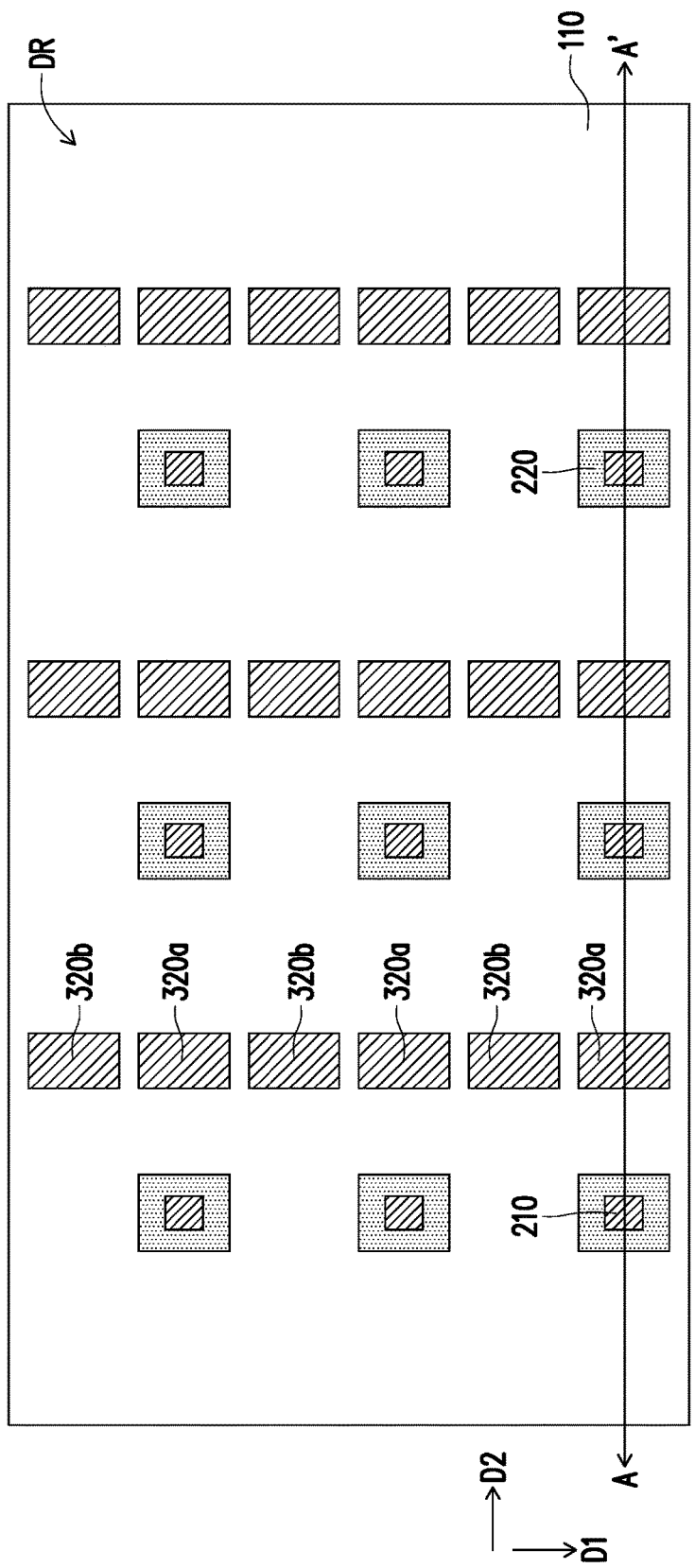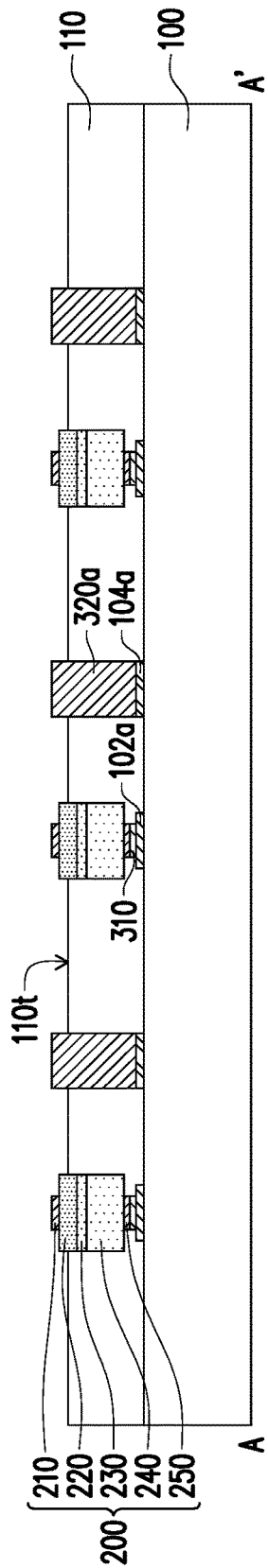
FIG. 5A
FIG. 5B

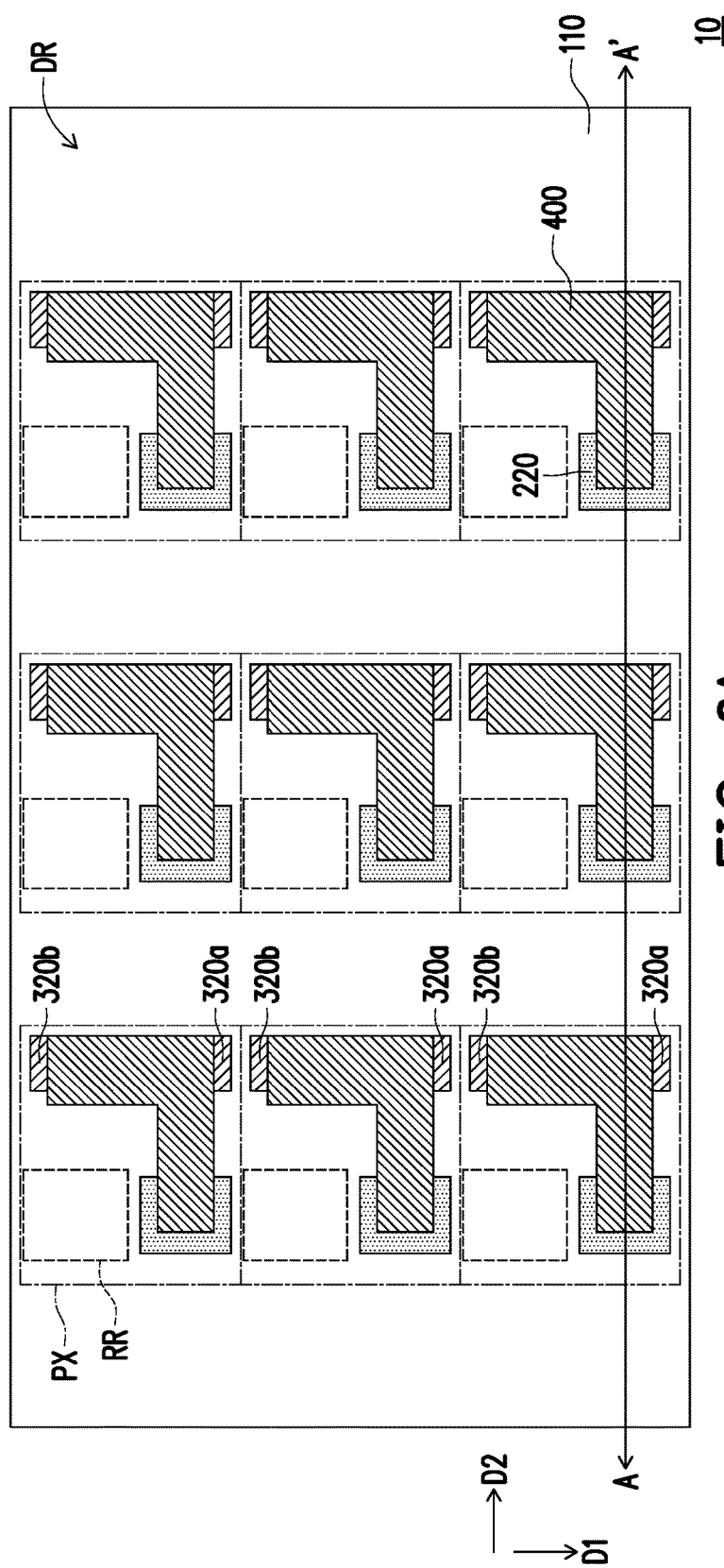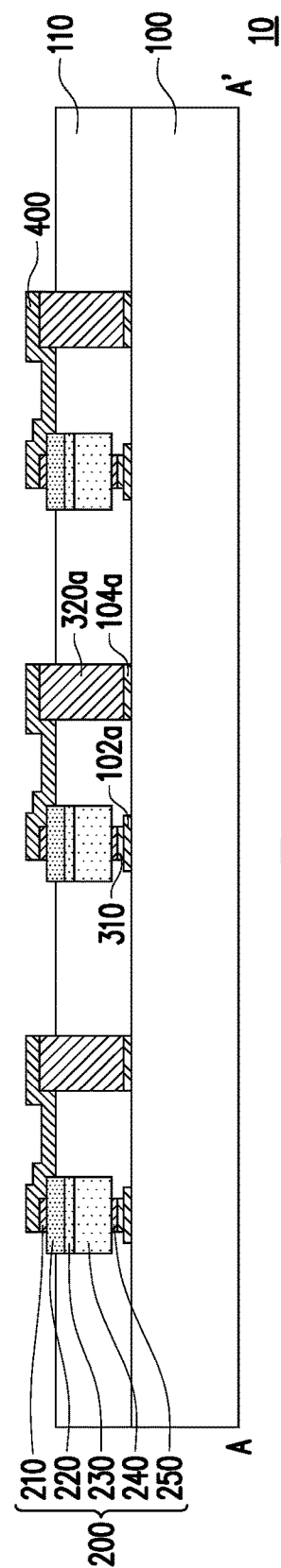
FIG. 6A
FIG. 6B

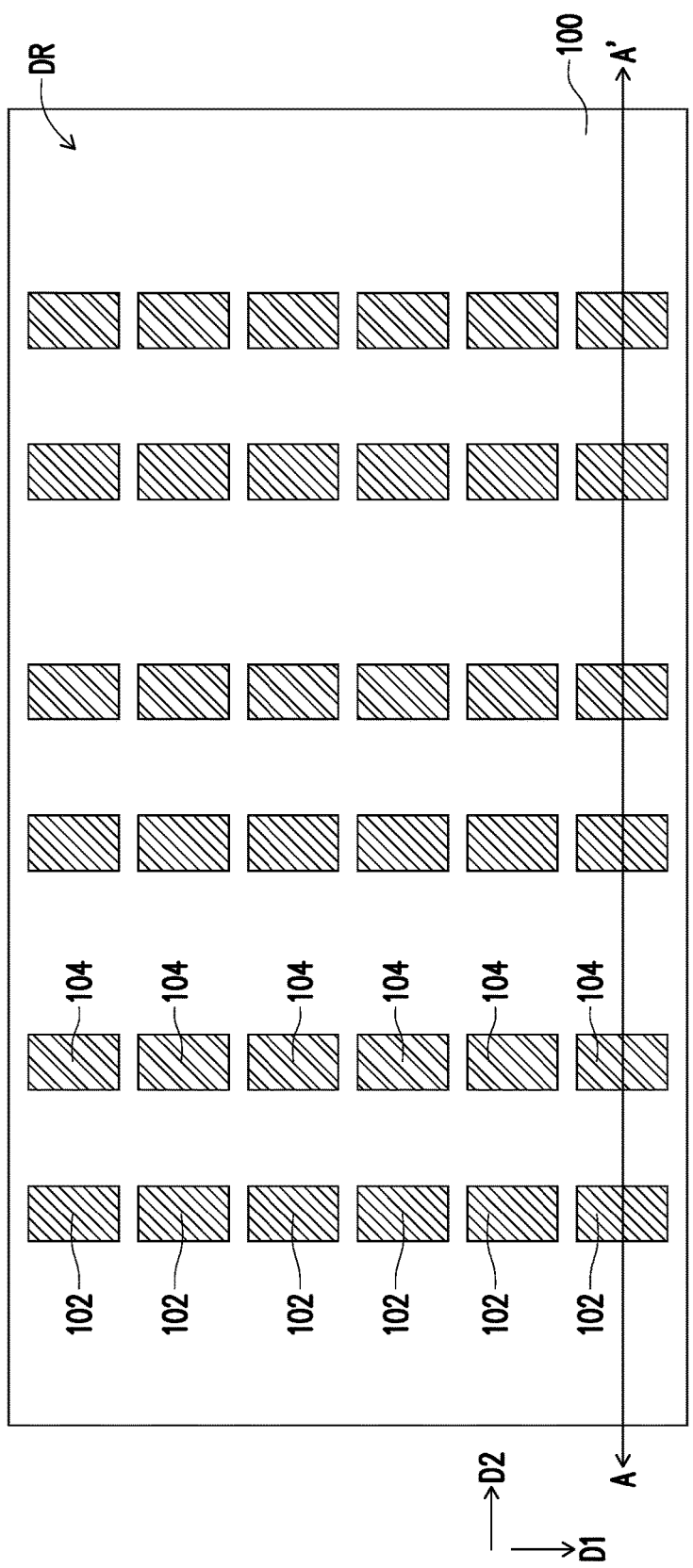
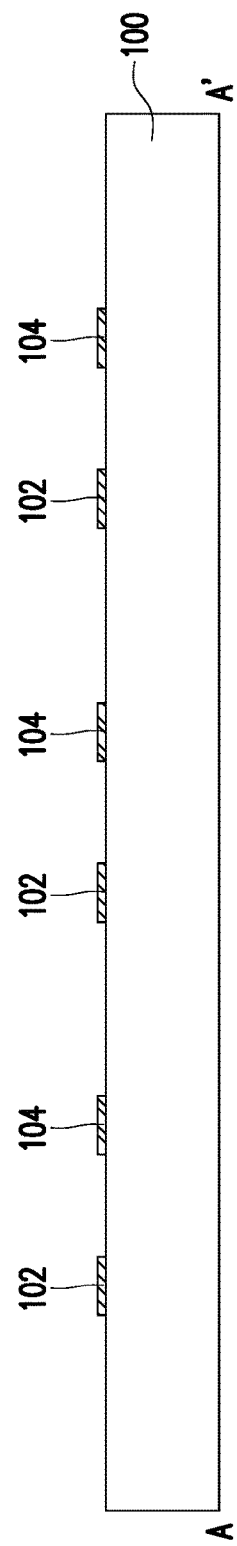

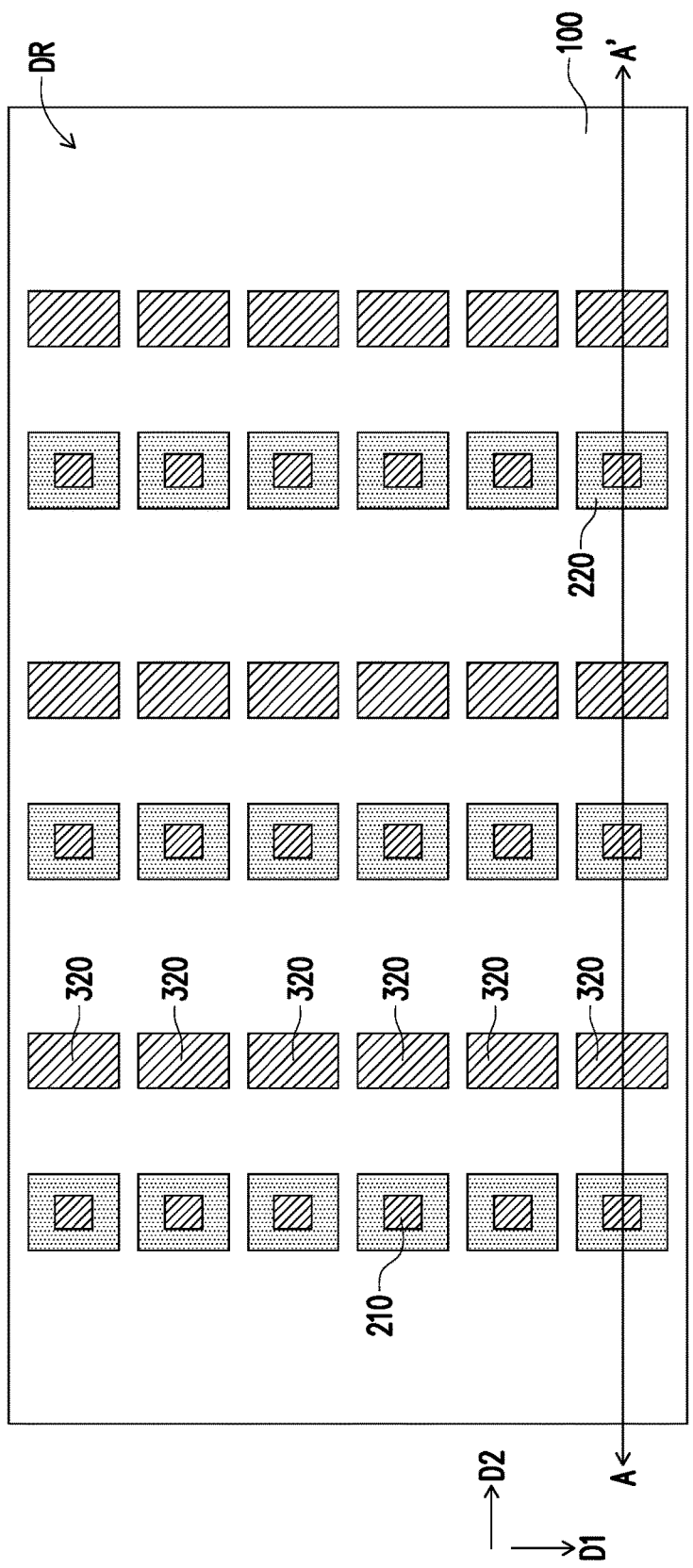
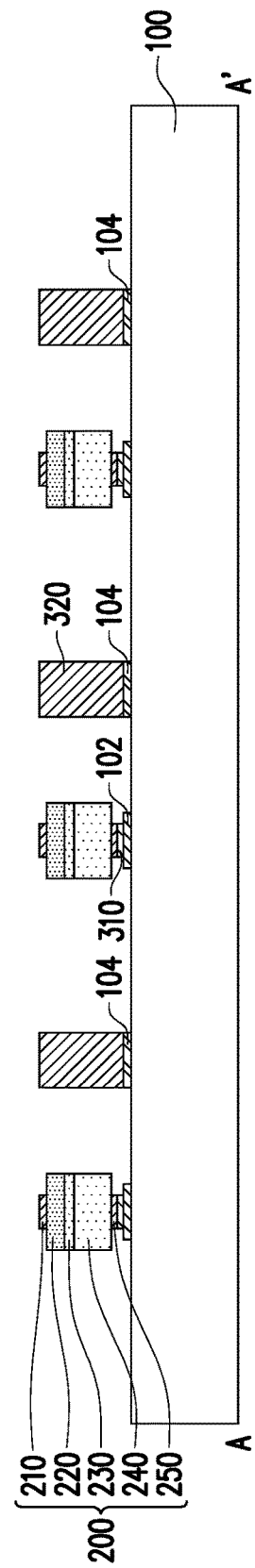
FIG. 12A
FIG. 12B

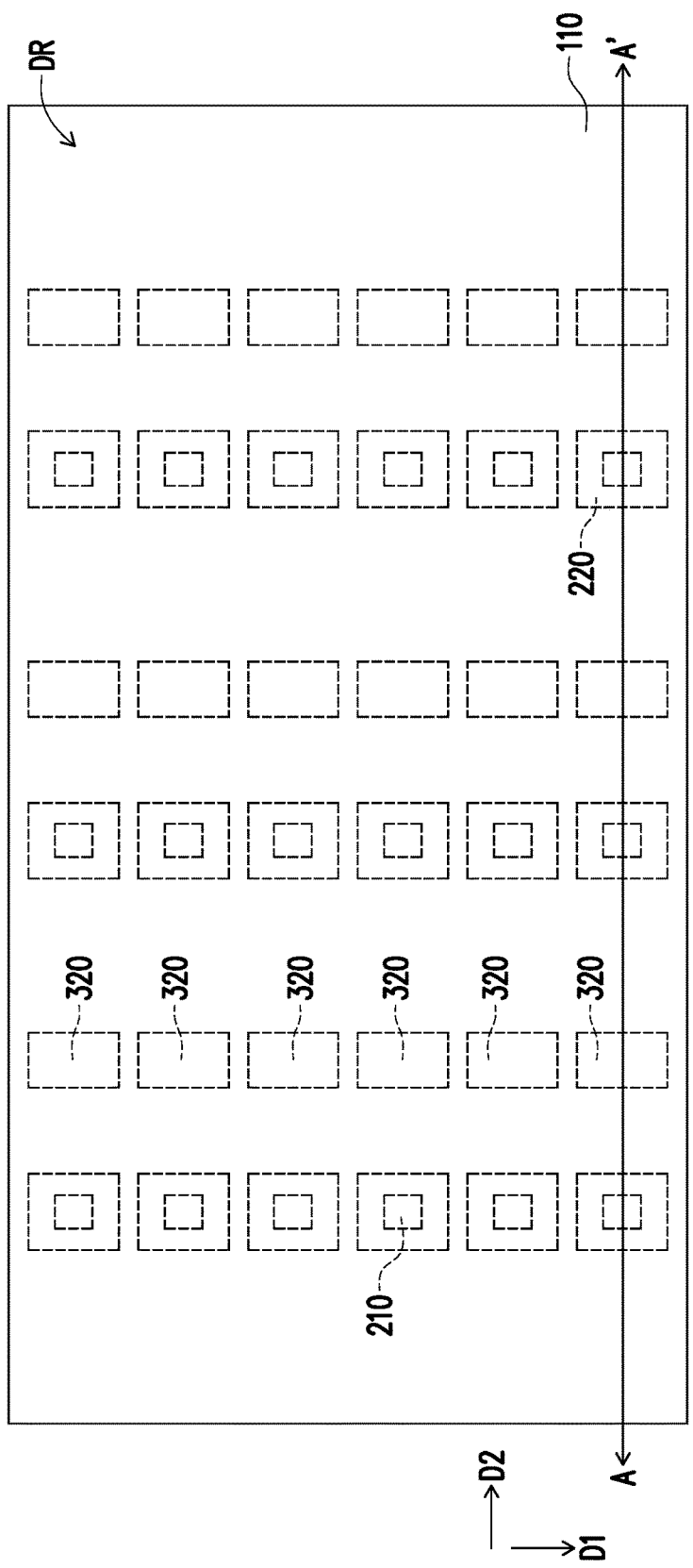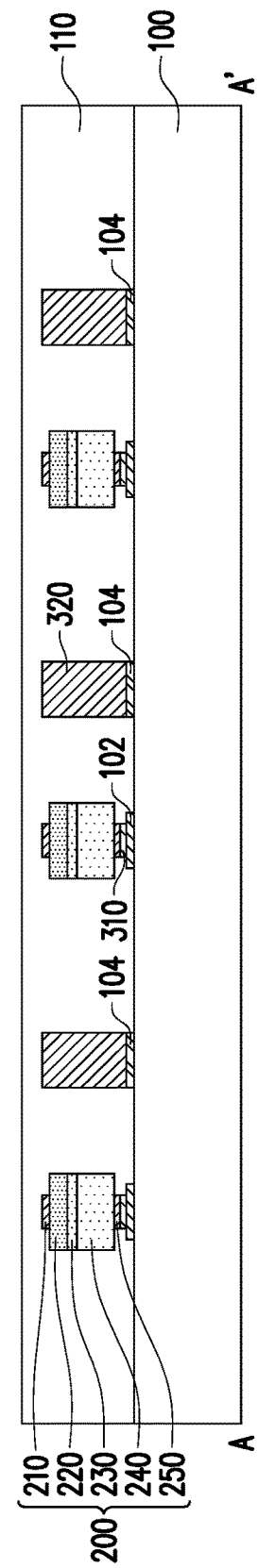
FIG. 13A
FIG. 13B

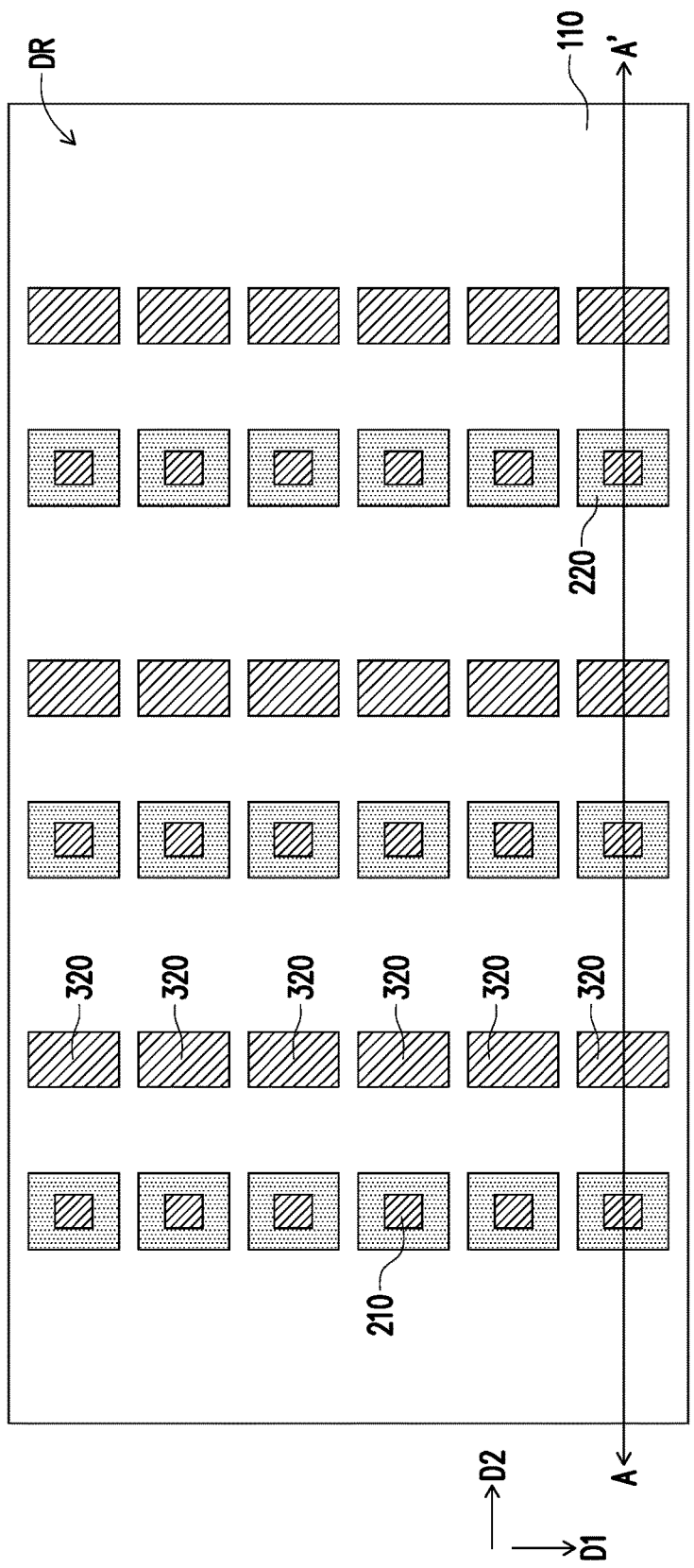
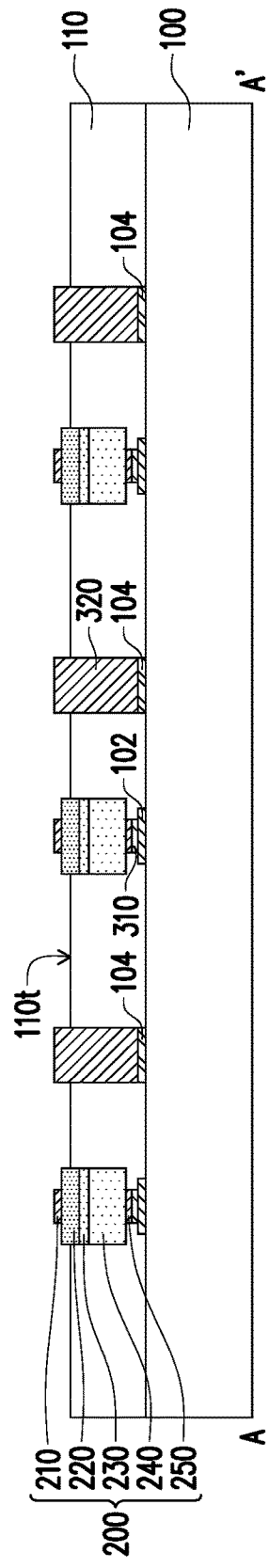
FIG. 14A
FIG. 14B

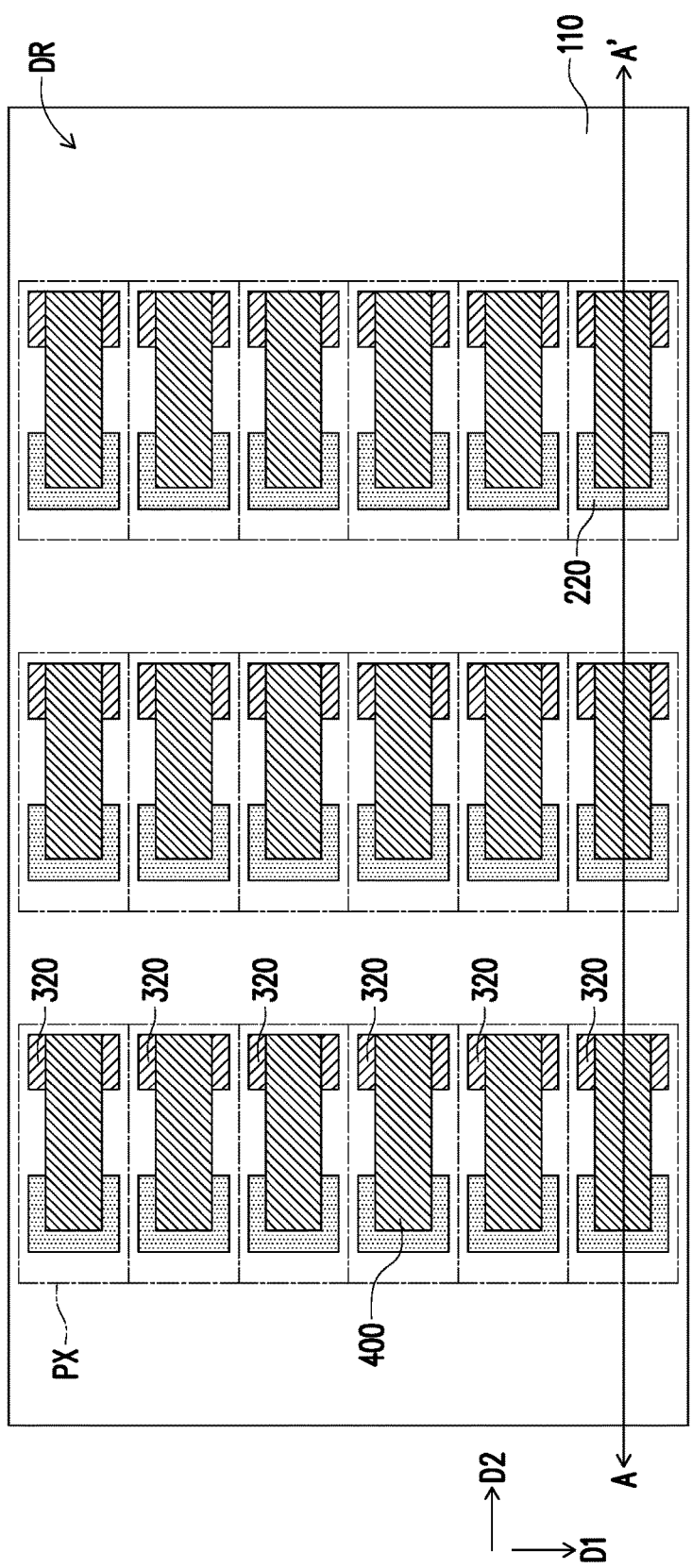
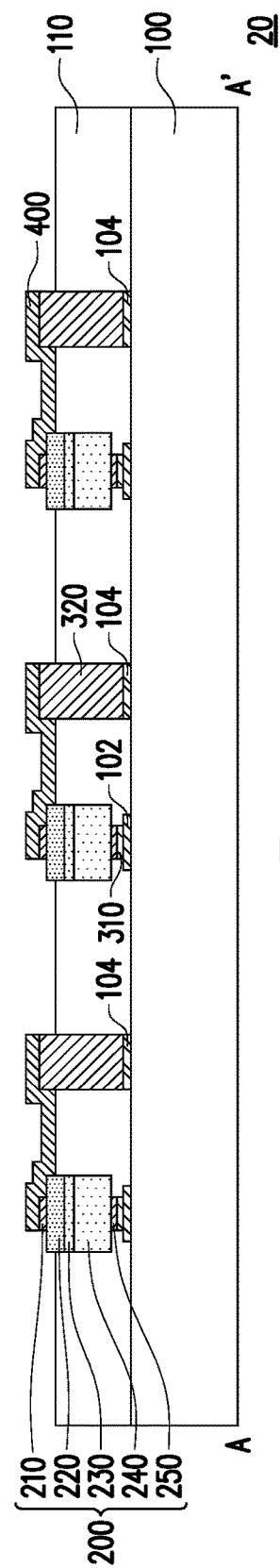
FIG. 15A
FIG. 15B

DISPLAY PANEL COMPRISING MULTIPLE PIXEL STRUCTURES INCLUDING REPAIRED PIXEL STRUCTURE

CROSS-REFERENCE TO RELATED APPLICATION

This application claims the priority benefit of China application serial no. 202211511699.9 filed on Nov. 29, 2022. The entirety of the above-mentioned patent application is hereby incorporated by reference herein and made a part of this specification.

BACKGROUND

Technical Field

The disclosure relates to a display panel and a manufacturing method thereof.

Description of Related Art

A light emitting diode is a kind of electroluminescent semiconductor element, which has the advantages of high efficiency, long service life, not easy to break, fast response speed, and high reliability. Generally speaking, the key technology for manufacturing micro light emitting diode displays is how to transfer a large number of micro light emitting diodes to the pixel array substrate. However, the transfer technology is a mechanical operation, and the effectiveness of the transfer technology depends on the precision of the machine and the precision and yield of the transfer device itself. When extracting the micro LEDs, one may encounter machine actuation errors and transfer device accuracy errors. When placing the micro LEDs, one may face another machine actual alignment deviation. If the micro LEDs are not placed in the correct position, or if there is damage during the transfer and placement process, the micro LEDs might not work properly. Generally speaking, pixels that are not working properly are repaired through a maintenance process. Therefore, many manufacturers are currently devoting themselves to developing methods that may improve the yield of the aforementioned maintenance process.

SUMMARY

The disclosure provides a display panel, which may improve the problem of poor electrical connection between the light emitting diode and the pad due to the step difference.

The disclosure provides a manufacturing method of a display panel, which may improve the yield of the maintenance process.

At least one embodiment of the disclosure provides a display panel. The display panel includes a circuit substrate, multiple pixel structures, and a molding layer. The circuit substrate has multiple first pad structures and multiple second pad structures. The pixel structures are disposed above a display region of the circuit substrate. Each of at least a portion of the pixel structures includes a first light emitting diode, a first conductive block, and a first conductive connection structure. The first light emitting diode is disposed on a corresponding first pad structure. The first conductive block is disposed on a corresponding second pad structure. The first conductive connection structure electrically connects the first light emitting diode to the first conductive block. The molding layer is located above the circuit substrate and surrounds the first light emitting diode and the first conductive block. The first conductive connection structure is located on the molding layer.

At least one embodiment of the disclosure provides a manufacturing method of a display panel, including the following operation. A circuit substrate is provided, in which the circuit substrate has multiple first pad structures and multiple second pad structures. Multiple conductive blocks are formed on the second pad structures. Multiple first light emitting diodes are disposed on the first pad structures. A molding layer is formed to surround the conductive blocks and the first light emitting diodes. Multiple first conductive connection structures are formed on the molding layer, in which the first conductive connection structures electrically connect at least a portion of the first light emitting diodes to at least a portion of the conductive blocks to form multiple pixel structures. A portion of the molding layer is removed to form an opening exposing at least a portion of the first pad structures. A second light emitting diode is disposed in the opening, and the second light emitting diode is bonded to at least a portion of the first pad structures. A second conductive connection structure is formed on the molding layer, in which the second conductive connection structure electrically connects the second light emitting diode to a corresponding one of the conductive blocks.

BRIEF DESCRIPTION OF THE DRAWING

FIG. 1A, FIG. 2A, FIG. 3A, FIG. 4A, FIG. 5A, FIG. 6A, FIG. 7A, FIG. 8A, and FIG. 9A are top schematic views of a manufacturing method of a display panel according to an embodiment of the disclosure.

FIG. 1B, FIG. 2B, FIG. 3B, FIG. 4B, FIG. 5B, and FIG. 6B are cross-sectional schematic views along a line A-A' of FIG. 1A, FIG. 2A, FIG. 3A, FIG. 4A, FIG. 5A, and FIG. 6A, respectively.

FIG. 10A, FIG. 11A, FIG. 12A, FIG. 13A, FIG. 14A, FIG. 15A, FIG. 16A, FIG. 17A, FIG. 18A, and FIG. 19A are top schematic views of a manufacturing method of a display panel according to an embodiment of the disclosure.

FIG. 10B, FIG. 11B, FIG. 12B, FIG. 13B, FIG. 14B, and FIG. 15B are cross-sectional schematic views along the line A-A' of FIG. 10A, FIG. 11A, FIG. 12A, FIG. 13A, FIG. 14A, and FIG. 15A, respectively.

DETAILED DESCRIPTION OF DISCLOSED EMBODIMENTS

FIG. 1A, FIG. 2A, FIG. 3A, FIG. 4A, FIG. 5A, FIG. 6A, FIG. 7A, FIG. 8A, and FIG. 9A are top schematic views of a manufacturing method of a display panel according to an embodiment of the disclosure. FIG. 1B, FIG. 2B, FIG. 3B, FIG. 4B, FIG. 5B, and FIG. 6B are cross-sectional schematic views along a line A-A' of FIG. 1A, FIG. 2A, FIG. 3A, FIG. 4A, FIG. 5A, and FIG. 6A, respectively. FIG. 7B, FIG. 8B, and FIG. 9B are cross-sectional schematic views along a line B-B' of FIG. 7A, FIG. 8A, and FIG. 9A, respectively. More specifically, FIG. 1A to FIG. 6B are schematic views of a manufacturing method of a display panel 10. When it is found that a portion of the pixel structures PX in the display panel 10 is faulty, the maintenance process shown in FIG. 7A to FIG. 9B is further performed to obtain the display panel 10'.

Figure 1A:
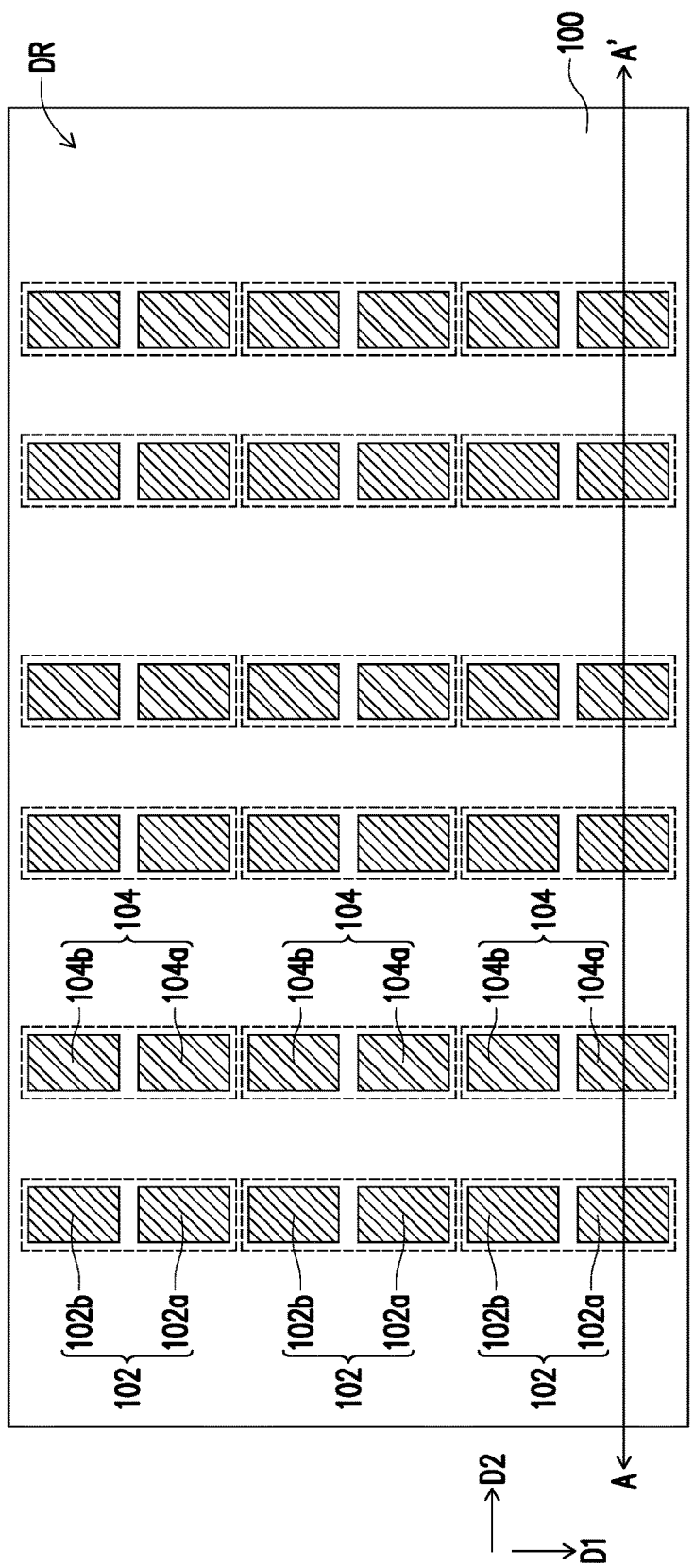
Figure 1B:
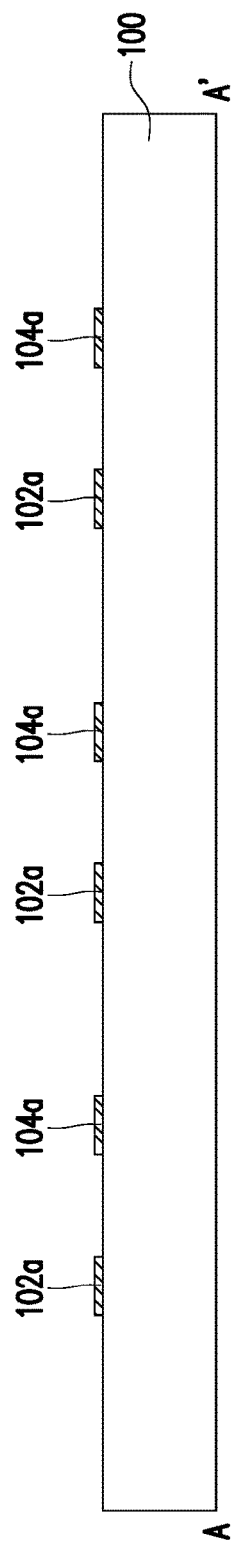

Referring to FIG. 1A and FIG. 1B, a circuit substrate 100 is provided. The circuit substrate 100 has multiple first pad structures 102 and multiple second pad structures 104 located on the surface. For example, the circuit substrate 100 includes a substrate and a circuit structure located on the substrate. The circuit structure includes conductive lines, active elements, passive elements, the first pad structure 102, the second pad structure 104, and other suitable components. For convenience of illustration, FIG. 1B and FIG. 1A show the first pad structure 102 and the second pad structure 104 in the circuit substrate 100, and other circuit structures in the circuit substrate 100 are omitted. The first pad structure 102 and the second pad structure 104 are disposed in the display region DR of the circuit substrate 100.

In this embodiment, the first pad structure 102 includes a first portion 102a and a second portion 102b that are separated from each other. The first portion 102a and the second portion 102b of the first pad structure 102 are electrically connected to each other through other conductive lines (not shown) or circuit structures. In other words, the same signal is applied to the first portion 102a and the second portion 102b. In other embodiments, the first portion 102a and the second portion 102b are connected to each other, in other words, the first pad structure 102 are not divided into two separate portions.

In this embodiment, the second pad structure 104 includes a third portion 104a and a fourth portion 104b that are separated from each other. The third portion 104a and the fourth portion 104b of the second pad structure 104 are electrically connected to each other through other conductive lines (not shown) or circuit structures. In other words, the same signal is applied to the third portion 104a and the fourth portion 104b. In other embodiments, the third portion 104a and the fourth portion 104b are connected to each other, in other words, the second pad structure 104 are not divided into two separate portions.

In this embodiment, in the first direction D1, the first portion 102a and the second portion 102b are arranged alternately, and the third portion 104a and the fourth portion 104b are arranged alternately. In the second direction D2, the first portion 102a and the third portion 104a are arranged alternately, and the second portion 102b and the fourth portion 104b are arranged alternately. In this embodiment, the first direction D1 is perpendicular to the second direction D2.

In this embodiment, the first pad structure 102 and the second pad structure 104 belong to the same patterned conductive layer. For example, the first pad structure 102 and the second pad structure 104 are formed by patterning the same conductive material layer. In some embodiments, the materials of the first pad structure 102 and the second pad structure 104 include metal, metal oxide, or other suitable materials. In some examples, each of the first pad structure 102 and the second pad structure 104 is a single-layer or multi-layer structure.

Referring to FIG. 2A and FIG. 2B, multiple first conductive blocks 320a and multiple second conductive blocks 320b are formed on the second pad structure 104. The first conductive block 320a is formed on the third portion 104a of the second pad structure 104, and the second conductive block 320b is formed on the fourth portion 104b of the second pad structure 104. The first conductive block 320a is separated from the second conductive block 320b.

In some embodiments, the first conductive block 320a and the second conductive block 320b further include a seed crystal layer (not shown). For example, the forming method for the first conductive block 320a and the second conductive block 320b includes the following steps. First, a seed crystal layer and a patterned photoresist layer are formed on the circuit substrate 100. The seed crystal layer contacts the third portion 104a and the fourth portion 104b of the second pad structure 104, and the patterned photoresist layer has multiple openings exposing the third portion 104a and the fourth portion 104b. Then, a metal material is formed on the seed crystal layer in the openings of the patterned photoresist layer by electroplating. Finally, the patterned photoresist layer and the excess seed crystal layer are removed, and the remaining metal material and seed crystal layer form the first conductive block 320a and the second conductive block 320b. In some embodiments, the seed crystal layer includes titanium, copper, other suitable conductive materials or a combination of the materials thereof, and the metal material formed by the aforementioned electroplating includes gold, copper, other suitable metal materials or a combination of the materials thereof.

In some embodiments, the first conductive block 320a and the second conductive block 320b have the same thickness T, in which the thickness T is 5 microns to 10 microns.

Referring to FIG. 3A and FIG. 3B, multiple first light emitting diodes 200 are disposed on the first pad structure 102. In this embodiment, the first light emitting diode 200 is located on the first portion 102a of the corresponding first pad structure 102.

The first light emitting diode 200 is a vertical light emitting diode and includes a first electrode 210, a first semiconductor layer 220, a light emitting layer 230, a second semiconductor layer 240, and a second electrode 250. The first semiconductor layer 220, the light emitting layer 230, and the second semiconductor layer 240 are stacked in sequence. In some embodiments, one of the first semiconductor layer 220 and the second semiconductor layer 240 is an N-type semiconductor, and the other is a P-type semiconductor. The first electrode 210 and the second electrode 250 are respectively connected to the first semiconductor layer 220 and the second semiconductor layer 240. In this embodiment, the top surface area of the first electrode 210 is smaller than the top surface area of the first semiconductor layer 220, but the disclosure is not limited thereto. The top surface area of the first electrode 210 may be adjusted according to actual requirements. For example, in other embodiments, the top surface area of the first electrode 210 is equal to the top surface area of the first semiconductor layer 220. In some embodiments, the first light emitting diode 200 includes light emitting diodes of different colors. For example, the first light emitting diode 200 includes red light emitting diodes, green light emitting diodes, blue light emitting diodes, or light emitting diodes of other colors. In some embodiments, the first light emitting diodes 200 of different colors are arranged in the first direction D1, and the first light emitting diodes 200 of the same color are arranged in the second direction D2, but the disclosure is not limited thereto. In other embodiments, the first light emitting diodes 200 of different colors are arranged in the second direction D2, and the first light emitting diodes 200 of the same color are arranged in the first direction D1.

In this embodiment, the second electrode 250 is bonded to the corresponding first portion 102a of the first pad structure 102. For example, the second electrode 250 is bonded to the first portion 102a through the conductive connection structure 310. The conductive connection structure 310 is, for example, anisotropic conductive glue, solder, or other suitable materials. In some embodiments, the second electrode 250 is eutectically bonded to the first portion 102a of the first pad structure 102.

In some embodiments, after bonding the first light emitting diode 200 to the first portion 102a, the top surface of the first light emitting diode 200 (the top surface of the first electrode 210) is approximately flush with the top surface of the first conductive block 320a and the top surface of the second conductive block 320b. In other words, based on the circuit substrate 100, the top surface of the first light emitting diode 200 is approximately at the same horizontal level as the top surface of the first conductive block 320a and the top surface of the second conductive block 320b.

Referring to FIG. 4A and FIG. 4B, the molding layer 110 is formed on the circuit substrate 100, and the molding layer 110 surrounds the first conductive block 320a, the second conductive block 320b, and the first light emitting diode 200.

In some embodiments, the molding layer 110 includes transparent material, gray material, or black material. For example, the molding layer 110 includes epoxy resin, silicone, or other suitable materials, and the molding layer 110 selectively includes carbon black, scattering particles, or other filling particles.

In this embodiment, the molding layer 110 covers the top surface of the first conductive block 320a, the top surface of the second conductive block 320b, and the top surface of the first light emitting diode 200. Therefore, plasma treatment must be performed to remove a portion of the molding layer 110 so that the first conductive block 320a, the second conductive block 320b, and the first light emitting diode 200 may be exposed, as shown in FIG. 5A and FIG. 5B. In some embodiments, the aforementioned plasma treatment is performed, for example, by sulfur hexafluoride plasma, carbon tetrafluoride plasma, oxygen plasma, or a combination thereof.

In some embodiments, the plasma treatment is performed until the top surface 110t of the molding layer 110 is lower than the top surface of the first conductive block 320a, the top surface of the second conductive block 320b, and the top surface of the first light emitting diode 200. However, in order to reduce the probability of short-circuiting the first light emitting diode 200, the molding layer 110 preferably covers the light emitting layer 230 and the second semiconductor layer 240. Specifically, based on the circuit substrate 100, the height of the top surface 110t of the molding layer 110 is preferably higher than the height of the light emitting layer 230 of the first light emitting diode 200.

Next, referring to FIG. 6A and FIG. 6B, multiple first conductive connection structures 400 are formed on the molding layer 110. The first conductive connection structure 400 electrically connects at least a portion of the first light emitting diode 200 to at least a portion of the first conductive block 320a and the second conductive block 320b to form multiple pixel structures PX. In this embodiment, the first pad structure 102 corresponding to each of the pixel structures PX includes a first portion 102a and a second portion 102b separated from each other, and the second pad structure 104 corresponding to each of the pixel structures PX includes a third portion 104a and a fourth portion 104b separated from each other.

In this embodiment, the first conductive connection structure 400 is an L-shaped structure formed by a portion extending along the first direction D1 and a portion extending along the second direction D2, and the first conductive connection structure 400 is simultaneously connected to the first conductive block 320a and the second conductive block 320b. In other embodiments, the first conductive connection structure 400 is a straight strip structure, in which the first conductive connection structure 400 is connected to the first conductive block 320a and not connected to the second conductive block 320b.

Figure 20:
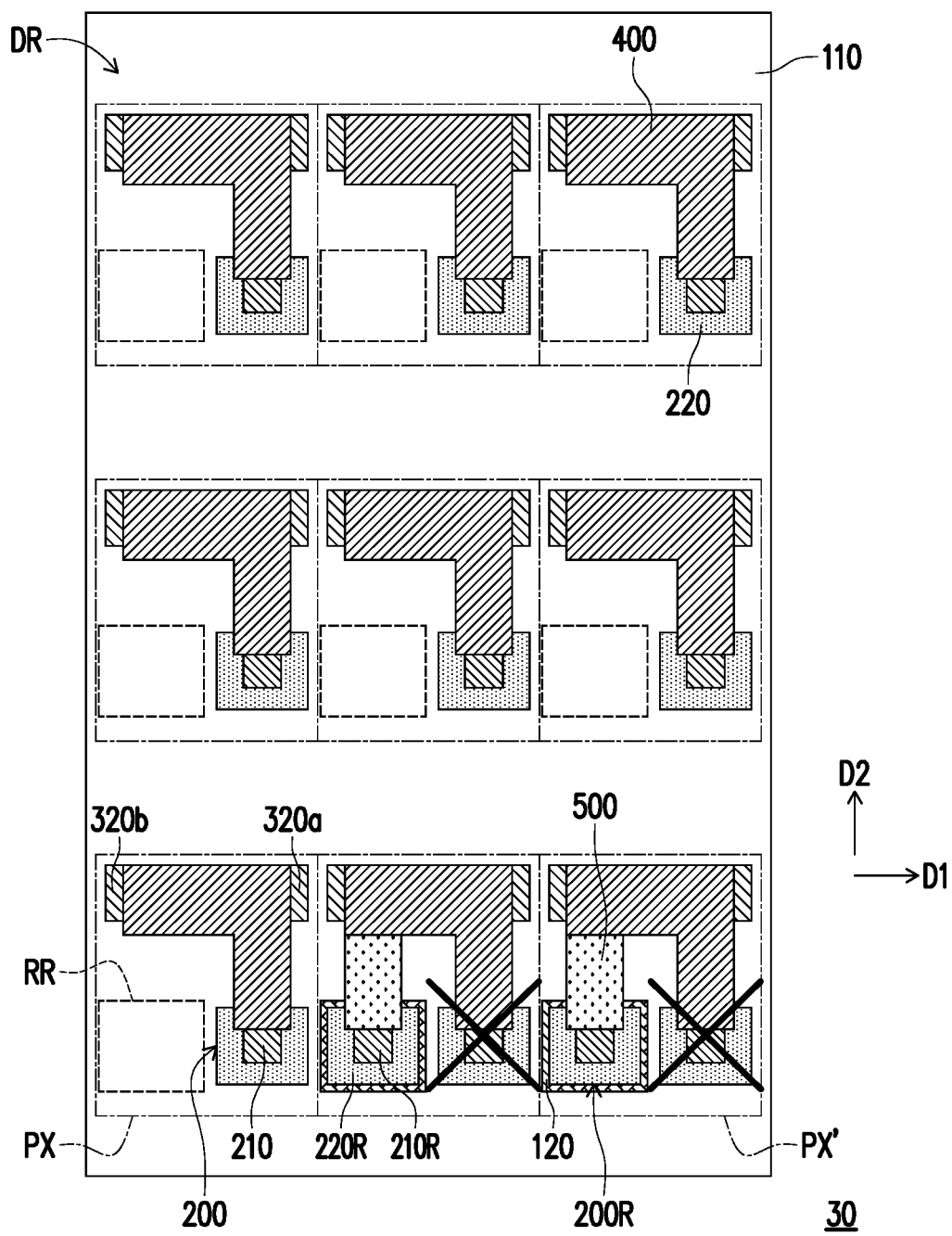
FIG. 20 is a top schematic view of a display panel according to an embodiment of the disclosure.

In some embodiments, the first conductive connection structure 400 includes a transparent conductive material, such as a conductive oxide (e.g., indium tin oxide, indium zinc oxide, aluminum tin oxide, aluminum zinc oxide, indium gallium zinc oxide, or combination of the materials thereof), therefore, even if the first conductive connection structure 400 covers the top surface of the first light emitting diode 200, it does not have a great impact on the brightness of the display panel 10, but the disclosure is not limited thereto. In other embodiments, the first conductive connection structure 400 includes an opaque conductive material, such as metal, therefore, the area of the first conductive connection structure 400 covering the top surface of the first light emitting diode 200 may be reduced. Moreover, as shown in FIG. 20, the first conductive connection structure 400 only contacts the side of the first electrode 210 of the first light emitting diode 200, so as to prevent the first conductive connection structure 400 from having a great impact on the brightness of the display panel 30. In some embodiments, the forming method of the first conductive connection structure 400 includes physical vapor deposition, chemical vapor deposition, atomic layer deposition, printing, inkjet printing, or other suitable methods. In some embodiments, the defining method for the pattern of the first conductive connection structure 400 includes, for example, a lithography process.

In this embodiment, each of at least a portion of the pixel structures PX includes a first light emitting diode 200, a first conductive block 320a, a second conductive block 320b, a first conductive connection structure 400, and a repair region RR. Both the first light emitting diode 200 and the repairing region RR overlap the first pad structure 102, in which the first light emitting diode 200 and the repairing region RR respectively overlap the first portion 102a and the second portion 102b.

After the first conductive connection structure 400 is formed, the pixel structures PX in the display panel 10 is inspected, and when a portion of the pixel structures PX is found to be faulty, the maintenance process shown in FIG. 7A to FIG. 9B is further performed. For example, a portion of the pixel structures PX is a faulty pixel structure PX. In the faulty pixel structure PX, the first light emitting diode 200 and/or the first conductive connection structure 400 are damaged, causing the first light emitting diode 200 in the faulty pixel structure PX to fail to emit light normally. In FIG. 7A to FIG. 9B, a cross mark is marked on the first light emitting diode 200 that cannot emit light normally.

Figure 7A:
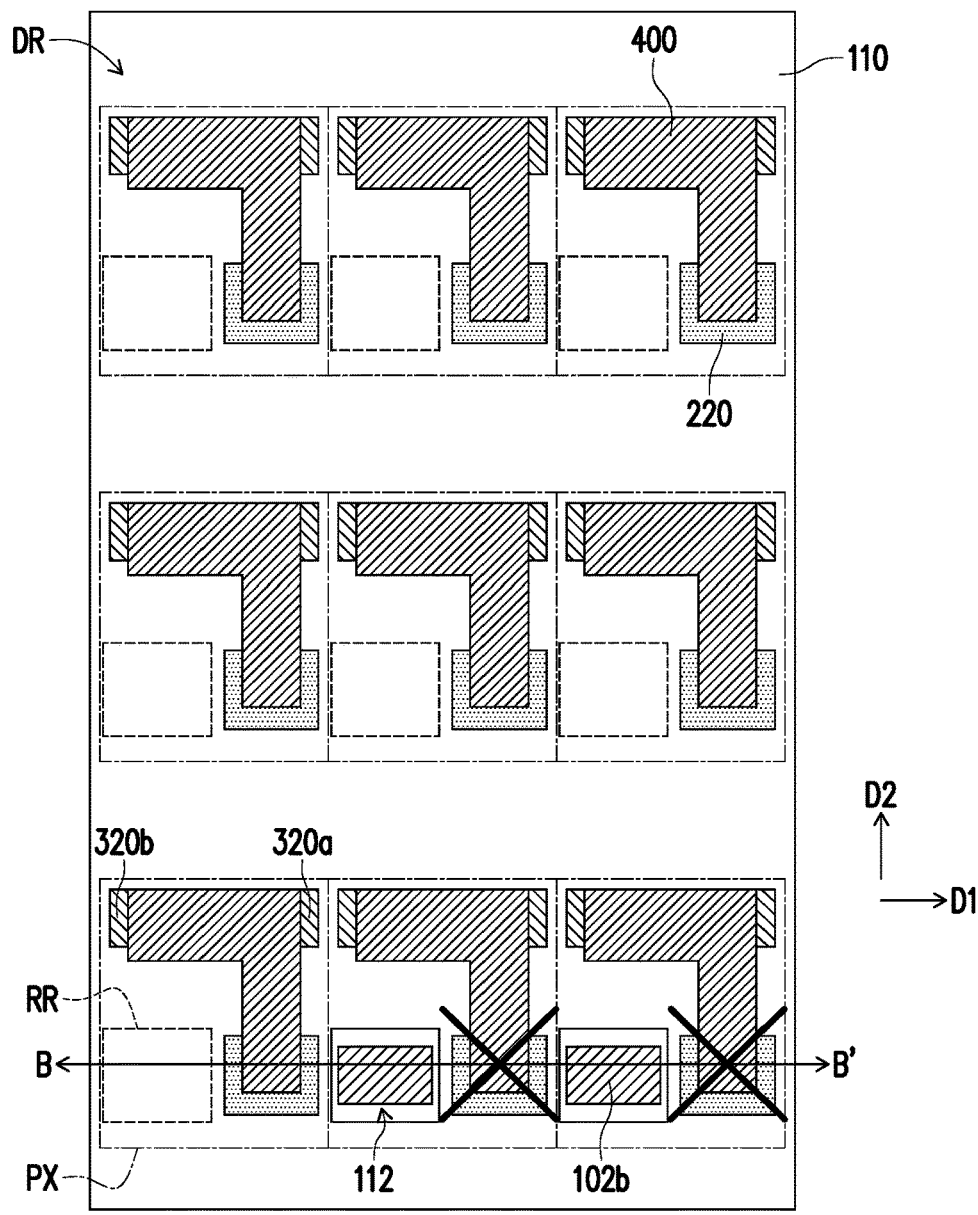
Figure 7B:
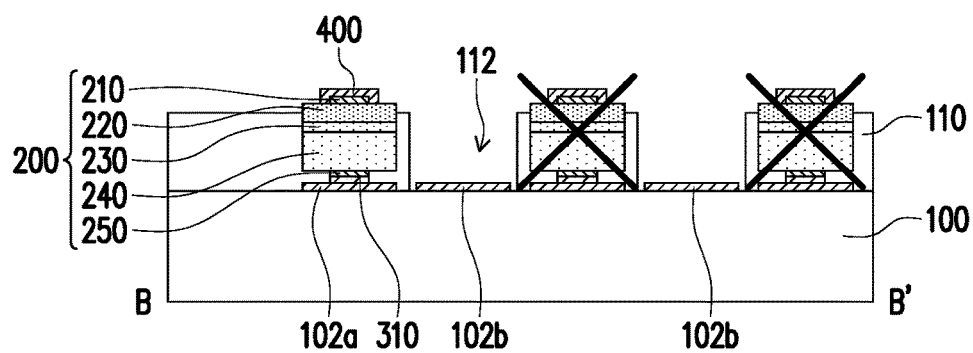
FIG. 7B, FIG. 8B, and FIG. 9B are cross-sectional schematic views along a line B-B' of FIG. 7A, FIG. 8A, and FIG. 9A, respectively.

Referring to FIG. 7A and FIG. 7B, a portion of the molding layer 110 is removed to form an opening 112 exposing at least a portion of the first pad structure 102. Specifically, the opening 112 of the molding layer 110 is located in the repair region RR of the faulty pixel structure PX, and the opening 112 exposes the first pad structure 102 of the faulty pixel structure PX. In this embodiment, the opening 112 exposes the second portion 102b of the first pad structure 102.

In some embodiments, the removing method for a portion of the molding layer 110 includes a dry etching process (e.g., a laser process) or a wet etching process.

Figure 8A:
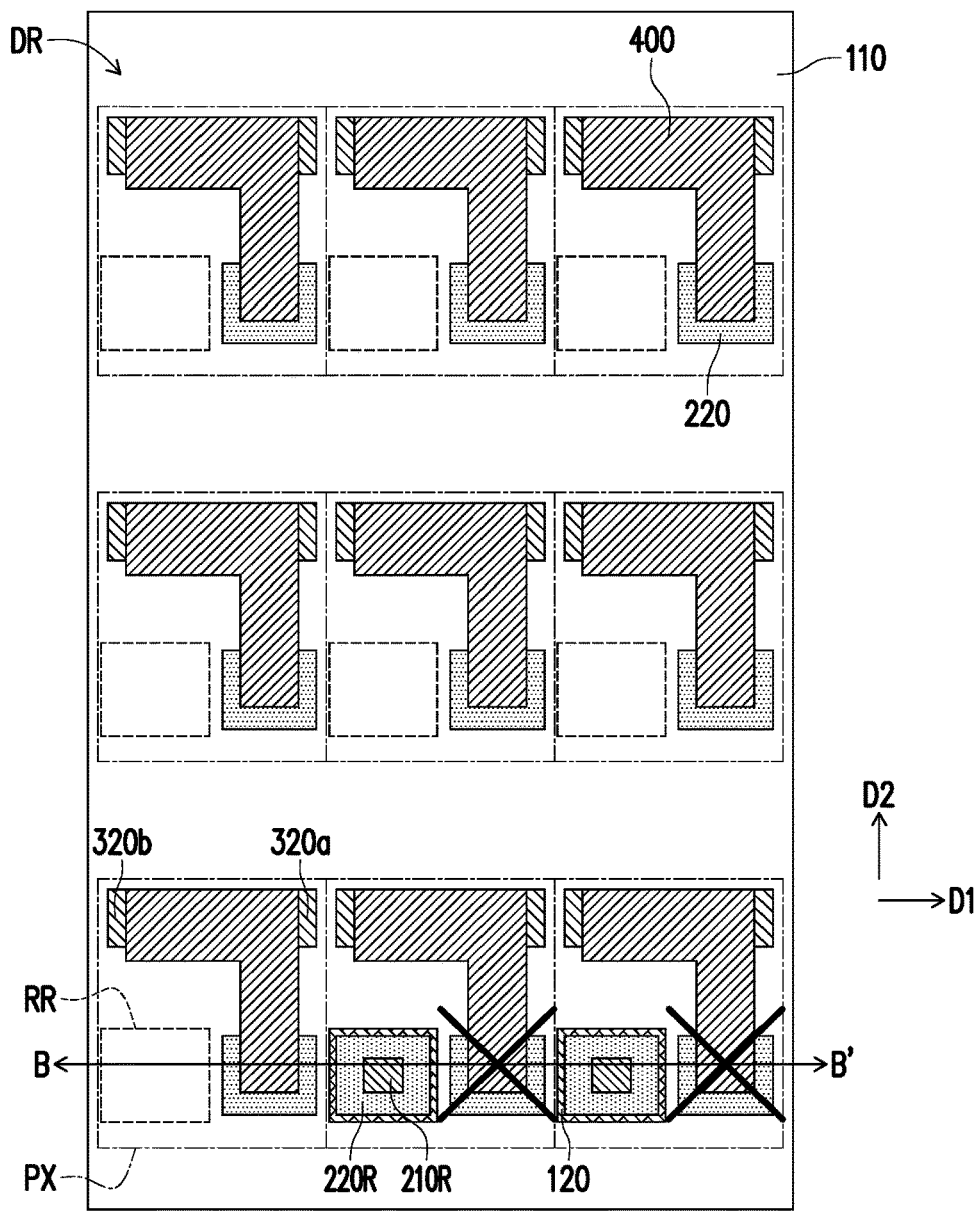
Figure 8B:
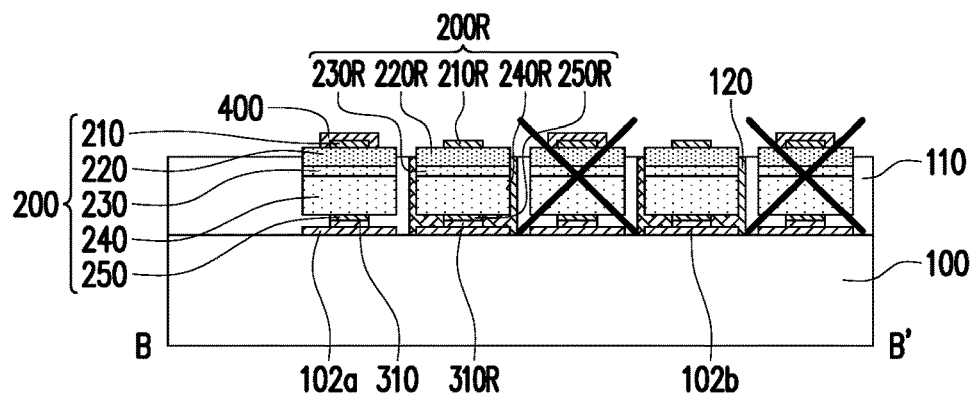

Referring to FIG. 8A and FIG. 8B, the second light emitting diode 200R is disposed in the opening 112. The second light emitting diode 200R is bonded to at least a portion of the first pad structure 102.

The second light emitting diode 200R is a vertical light emitting diode and includes a first electrode 210R, a first semiconductor layer 220R, a light emitting layer 230R, a second semiconductor layer 240R, and a second electrode 250R. The first semiconductor layer 220R, the light emitting layer 230R, and the second semiconductor layer 240R are stacked in sequence. In some embodiments, one of the first semiconductor layer 220R and the second semiconductor layer 240R is an N-type semiconductor, and the other is a P-type semiconductor. The first electrode 210R and the second electrode 250R are respectively connected to the first semiconductor layer 220R and the second semiconductor layer 240R. In some embodiments, the second light emitting diode 200R includes light emitting diodes of different colors. For example, the second light emitting diode 200R includes red light emitting diodes, green light emitting diodes, blue light emitting diodes, or light emitting diodes of other colors. In some embodiments, the first light emitting diode 200 and the second light emitting diode 200R in a faulty pixel structure PX are light emitting diodes of the same color.

In some embodiments, after the second light emitting diode 200R is disposed in the opening 112, a filling material 120 is formed to fill the gap between the second light emitting diode 200R and the opening 112. The second light emitting diode 200R and the filling material 120 are filled into the opening 112, and the filling material 120 surrounds the second light emitting diode 200R. In some embodiments, the forming method of the filling material 120 includes inkjet printing, glue dispensing, or other suitable processes. In some embodiments, the filling material 120 includes epoxy resin, silicone, acrylic or other suitable materials, and the filling material 120 selectively includes carbon black, scattering particles, or other filling particles. The filling material 120 and the molding layer 110 may include the same or different materials.

Figure 9A:
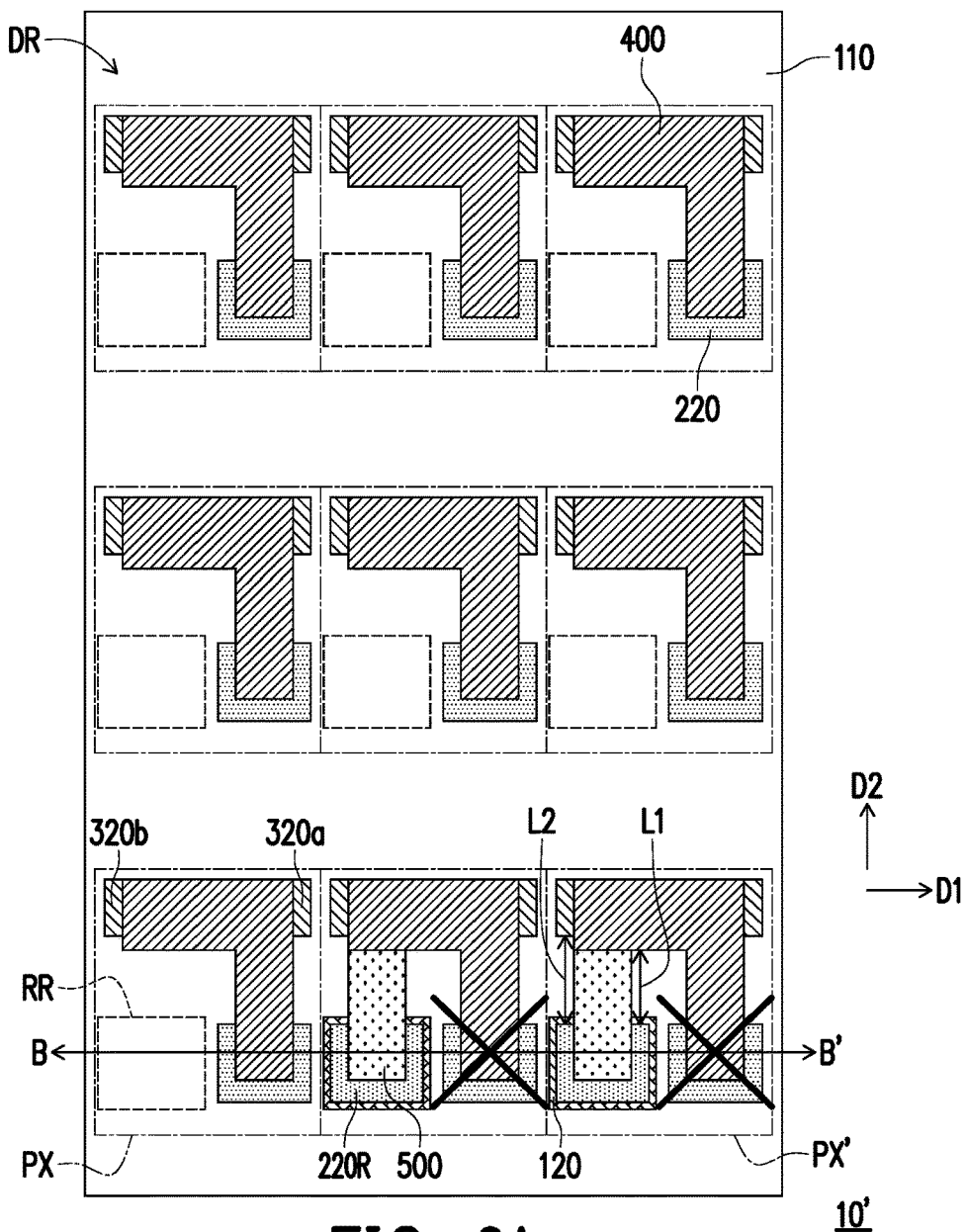
Figure 9B:
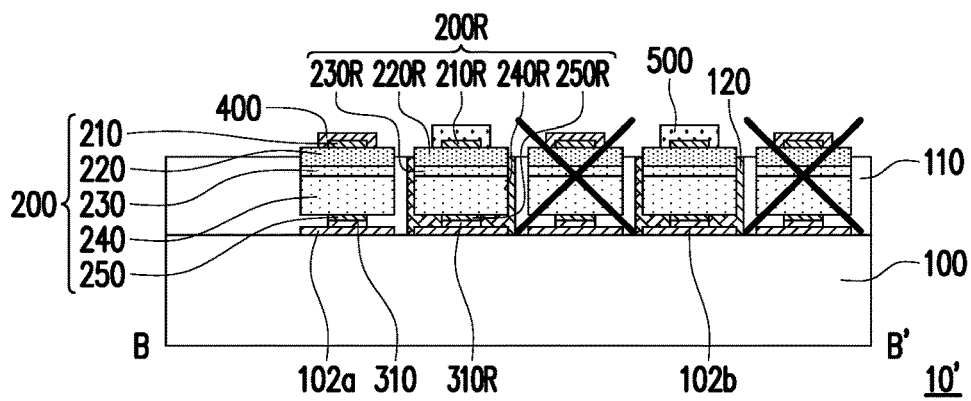

Referring to FIG. 9A and FIG. 9B, a second conductive connection structure 500 is formed on the molding layer 110. The second conductive connection structure 500 electrically connects the second light emitting diode 200R to a corresponding one of the conductive blocks, and so far the display panel 10' including the repaired pixel structure PX' is formed.

In some embodiments, the second conductive connection structure 500 includes a transparent or opaque conductive material formed by glue dispensing, inkjet printing, or other suitable methods, but the disclosure is not limited thereto. In other embodiments, the second conductive connection structure 500 includes conductive materials formed by chemical vapor deposition, such as tungsten, other metal materials, or other suitable conductive materials. In some embodiments, the first conductive connection structure 400 and the second conductive connection structure 500 include the same or different materials.

Each of the repaired pixel structures PX' includes the first light emitting diode 200, the second light emitting diode 200R, the first conductive block 320a, the second conductive block 320b, the first conductive connection structure 400, the filling material 120, and the second conductive connection structure 500. The first light emitting diode 200 and the second light emitting diode 200R are respectively disposed on the first portion 102a and the second portion 102b of the first pad structure 102. The first conductive block 320a and the second conductive block 320b are respectively disposed on the third portion 104a and the fourth portion 104b of the second pad structure 104. The first conductive connection structure 400 and the second conductive connection structure 500 are located on the molding layer 110. The second conductive connection structure 500 electrically connects the second light emitting diode 200R to the second conductive block 320b. In this embodiment, the first light emitting diode 200 in the repaired pixel structure PX' is not removed, but the disclosure is not limited thereto. In other embodiments, the first light emitting diode 200 in the repaired pixel structure PX' is removed through an additional process.

In the repaired pixel structure PX' of this embodiment, since the first conductive connection structure 400 is L-shaped, the second conductive connection structure 500 electrically connects the first electrode 210R of the second light emitting diode 200R to the first conductive connection structure 400, and the second conductive connection structure 500 is electrically connected to the second conductive block 320b through the first conductive connection structure 400. The horizontal distance L1 between the second light emitting diode 200R and the first conductive connection structure 400 is smaller than the horizontal distance L2 between the second light emitting diode 200R and the second conductive block 320b. In other words, with the design of the first conductive connection structure 400, the second conductive connection structure 500 may be electrically connected to the first conductive block 320a and the second conductive block 320b without directly contacting the first conductive block 320a or the second conductive block 320b. Therefore, the size of the second conductive connection structure 500 may be reduced, and the impact of the second conductive connection structure 500 on the brightness of the display panel 10' may be reduced.

In this embodiment, since the conductive connection structure 500 is formed on the molding layer 110, and may be electrically connected to the second pad structure 104 through the first conductive block 320a and/or the second conductive block 320b, therefore, it is possible to prevent disconnection of the conductive connection structure 500 caused by the step difference between the first electrode 210R of the second light emitting diode 200R and the second pad structure 104 and improve the yield of the maintenance process.

FIG. 10A, FIG. 11A, FIG. 12A, FIG. 13A, FIG. 14A, FIG. 15A, FIG. 16A, FIG. 17A, FIG. 18A, and FIG. 19A are top schematic views of a manufacturing method of a display panel according to an embodiment of the disclosure. FIG. 10B, FIG. 11B, FIG. 12B, FIG. 13B, FIG. 14B, and FIG. 15B are cross-sectional schematic views along the line A-A' of FIG. 10A, FIG. 11A, FIG. 12A, FIG. 13A, FIG. 14A, and FIG. 15A, respectively. FIG. 16B, FIG. 17B, FIG. 18B, and FIG. 19B are cross-sectional schematic views along the line B-B' of FIG. 16A, FIG. 17A, FIG. 18A, and FIG. 19A, respectively. More specifically, FIG. 10A to FIG. 15B are schematic views of a manufacturing method of a display panel 20. When it is found that a portion of the pixel structures PX in the display panel 20 is faulty, the maintenance process shown in FIG. 16A to FIG. 19B is further performed to obtain the display panel 20'.

It is noted that the embodiment of FIG. 10A to FIG. 19B uses the reference numerals and a part of the contents of the embodiment of FIG. 1A to FIG. 9B, and the same or similar reference numerals are used to denote the same or similar elements, and the description of the same technical content is omitted. For the description of the omitted portion, reference may be made to the foregoing embodiment, and details are not described herein.

Referring to FIG. 10A and FIG. 10B, a circuit substrate 100 is provided. The circuit substrate 100 has multiple first pad structures 102 and multiple second pad structures 104 located on the surface. In this embodiment, each of the first pad structures 102 does not include multiple portions separated from each other, and each of the second pad structures 104 does not include multiple portions separated from each other.

In this embodiment, the first pad structures 102 are arranged along the first direction D1, and the second pad structures 104 are arranged along the first direction D1. In the second direction D2, the first pad structures 102 and the second pad structures 104 are arranged alternately.

Figure 11A:
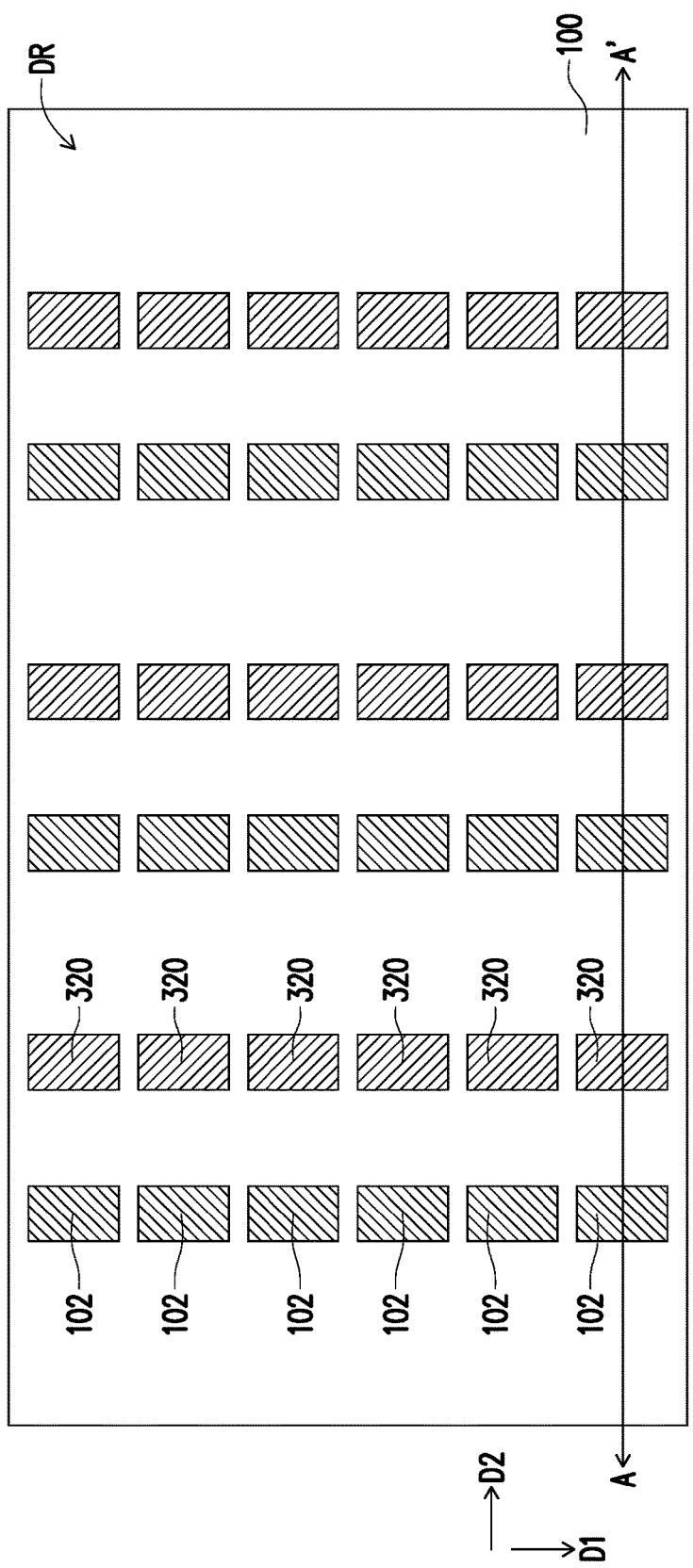
Figure 11B:
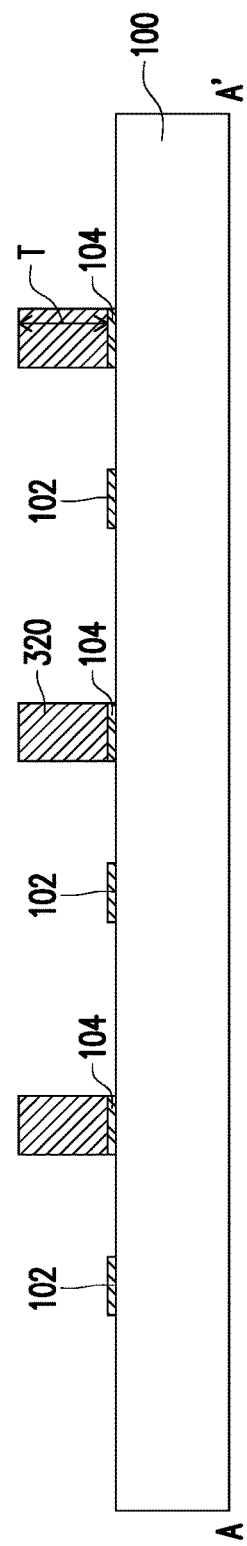
Figure 16A:
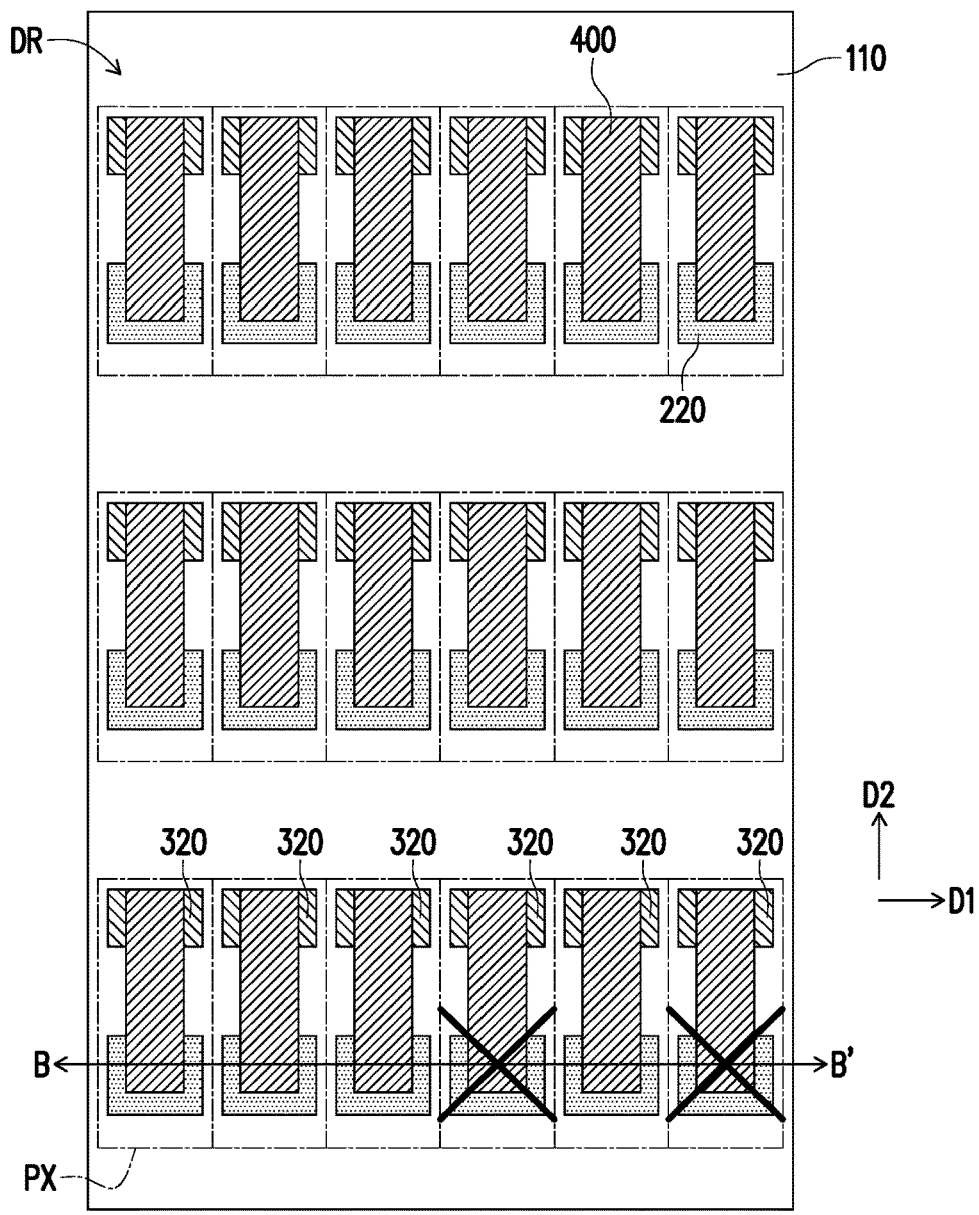
Figure 16B:
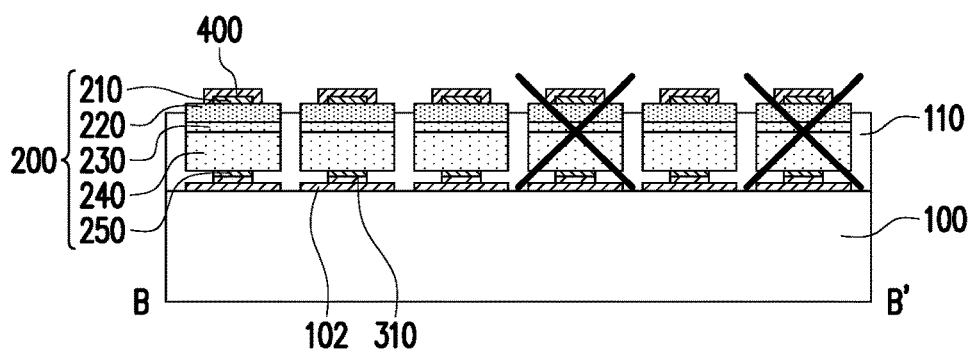
FIG. 16B, FIG. 17B, FIG. 18B, and FIG. 19B are cross-sectional schematic views along the line B-B' of FIG. 16A, FIG. 17A, FIG. 18A, and FIG. 19A, respectively.

Referring to FIG. 11A and FIG. 11B, multiple first conductive blocks 320 are formed on the second pad structures 104.

In some embodiments, the first conductive block 320 further includes a seed crystal layer (not shown). For example, the forming method of the first conductive block 320 includes the following steps. First, a seed crystal layer and a patterned photoresist layer are formed on the circuit substrate 100, in which the seed crystal layer contacts the second pad structure 104, and the patterned photoresist layer has an opening exposing the second pad structure 104. Then, a metal material is formed in the opening of the patterned photoresist layer by electroplating. Finally, the patterned photoresist layer and the excess seed crystal layer are removed, and the remaining metal material and seed crystal layer form the first conductive block 320. In some embodiments, the seed crystal layer includes titanium, chromium, copper, other suitable conductive materials or a combination of the materials thereof, and the metal material formed by the aforementioned electroplating includes gold, copper, other suitable metal materials or a combination of the materials thereof.

In some embodiments, the thickness T of the first conductive block 320 is 5 microns to 10 microns.

Referring to FIG. 12A and FIG. 12B, multiple first light emitting diodes 200 are disposed on the first pad structure 102. In some embodiments, the first light emitting diode 200 includes light emitting diodes of different colors. For example, the first light emitting diode 200 includes red light emitting diodes, green light emitting diodes, blue light emitting diodes, or light emitting diodes of other colors. In some embodiments, the first light emitting diodes 200 of different colors are arranged in the first direction D1, and the first light emitting diodes 200 of the same color are arranged in the second direction D2, but the disclosure is not limited thereto. In other embodiments, the first light emitting diodes 200 of different colors are arranged in the second direction D2, and the first light emitting diodes 200 of the same color are arranged in the first direction D1. In some embodiments, two rows of the first light emitting diodes 200 of the same color are arranged together. For example, two rows of red light emitting diodes are arranged together, two rows of green light emitting diodes are arranged together, and two rows of blue light emitting diodes are arranged together. In this case, two adjacent light emitting diodes of the same color may be turned on and off at the same time.

In this embodiment, the second electrode 250 is bonded to the corresponding first pad structure 102. For example, the second electrode 250 is bonded to the first pad structure 102 through the conductive connection structure 310. In some embodiments, the second electrode 250 is eutectically bonded to the first pad structure 102.

In some embodiments, after bonding the first light emitting diode 200 to the first pad structure 102, the top surface of the first light emitting diode 200 (the top surface of the first electrode 210) is approximately flush with the top surface of the first conductive block 320. In other words, based on the circuit substrate 100, the top surface of the first light emitting diode 200 is approximately at the same horizontal level as the first conductive block 320.

Referring to FIG. 13A and FIG. 13B, the molding layer 110 is formed on the circuit substrate 100, and the molding layer 110 surrounds the first conductive block 320 and the first light emitting diode 200.

In this embodiment, the molding layer 110 covers the top surface of the first conductive block 320 and the top surface of the first light emitting diode 200. Therefore, plasma treatment must be performed to remove a portion of the molding layer 110 so that the first conductive block 320 and the first light emitting diode 200 may be exposed, as shown in FIG. 14A and FIG. 14B. In some embodiments, the aforementioned plasma treatment is performed, for example, by sulfur hexafluoride plasma, carbon tetrafluoride plasma, oxygen plasma, or a combination thereof.

In some embodiments, the plasma treatment is performed until the top surface 110t of the molding layer 110 is lower than the top surface of the first conductive block 320 and the top surface of the first light emitting diode 200. However, in order to reduce the probability of short-circuiting the first light emitting diode 200, the molding layer 110 preferably covers the light emitting layer 230 and the second semiconductor layer 240. Specifically, based on the circuit substrate 100, the height of the top surface 110t of the molding layer 110 is preferably higher than the height of the light emitting layer 230 of the first light emitting diode 200.

Next, referring to FIG. 15A and FIG. 15B, multiple first conductive connection structures 400 are formed on the molding layer 110. The first conductive connection structure 400 electrically connects at least a portion of the first light emitting diode 200 to at least a portion of the first conductive block 320 to form multiple pixel structures PX. In this embodiment, the first conductive connection structure 400 is a straight strip extending along the first direction D1.

In this embodiment, each of the pixel structures PX corresponds to a first pad structure 102 and a second pad structure 104. In this embodiment, each of at least a portion of the pixel structures PX includes a first light emitting diode 200, a first conductive block 320, and a first conductive connection structure 400. The first light emitting diode 200 and the first conductive block 320 respectively overlap the first pad structure 102 and the second pad structure 104.

In other embodiments, each of the pixel structures PX corresponds to two adjacent first pad structures 102 and corresponding two second pad structures 104, and each of at least a portion of the pixel structures PX includes two adjacent first light emitting diodes 200, two adjacent first conductive blocks 320, and two adjacent first conductive connection structures 400. In the case that each of the pixel structures PX includes two first light emitting diodes 200, even if one of the first light emitting diodes 200 in the pixel structure PX is damaged, one may choose not to repair the pixel structure PX.

After the first conductive connection structure 400 is formed, the pixel structures PX in the display panel 20 is inspected, and when a portion of the pixel structures PX is found to be faulty, the maintenance process shown in FIG.

Figure 18A:
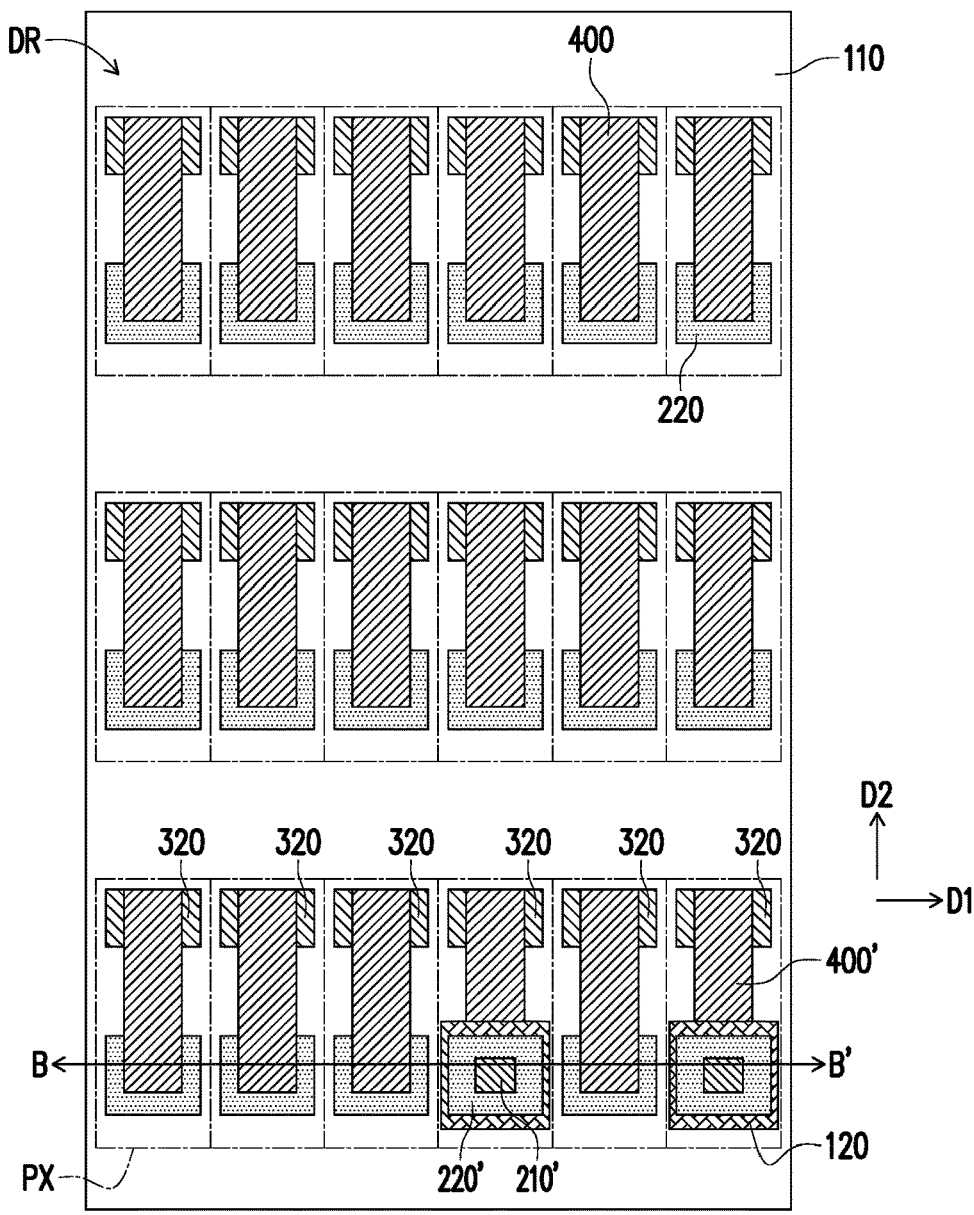
Figure 18B:
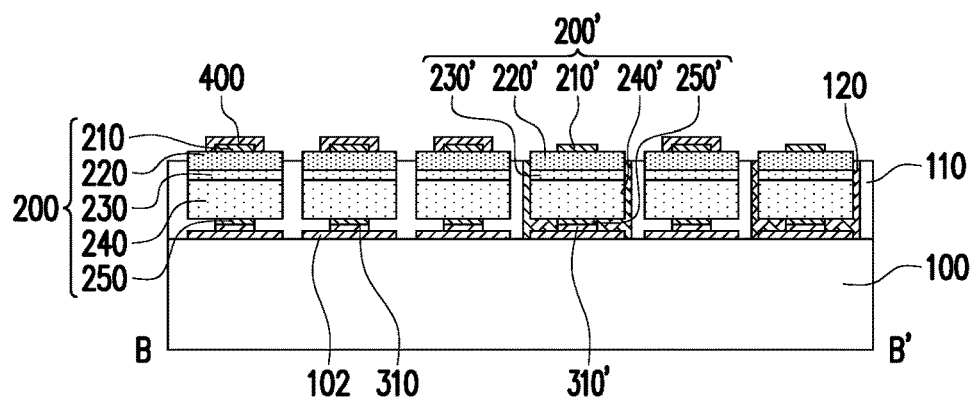
Figure 19A:
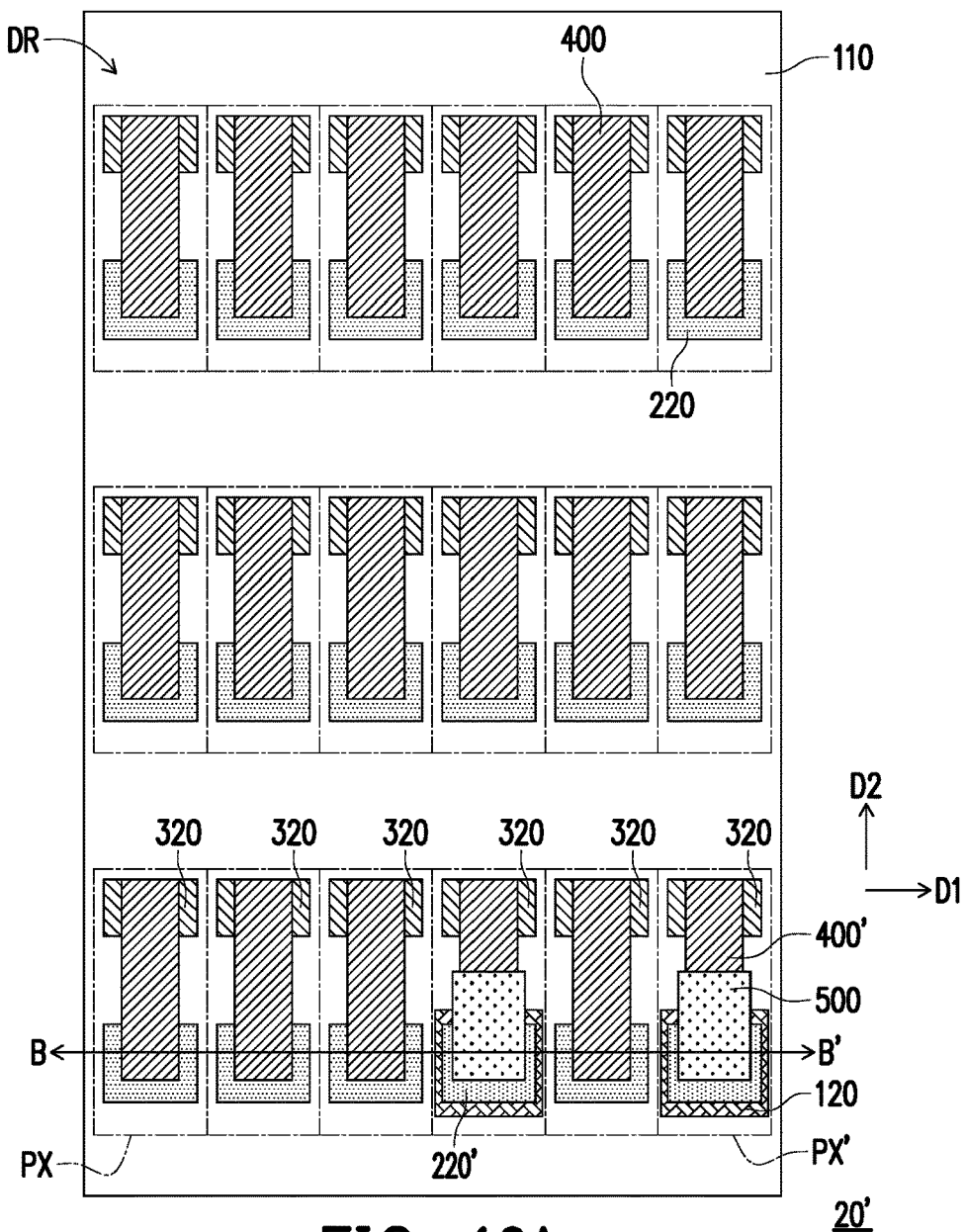
Figure 19B:
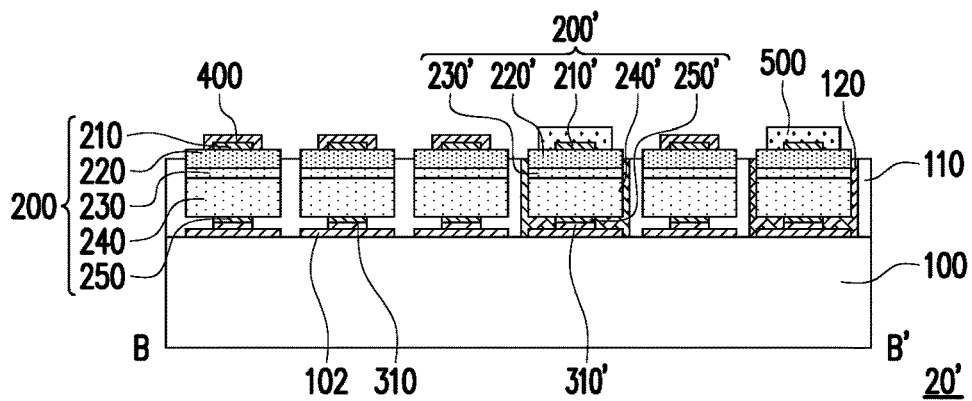

16A to FIG. 19B is further performed. For example, a portion of the pixel structures PX is a faulty pixel structure PX. In the faulty pixel structure PX, the first light emitting diode 200 and/or the first conductive connection structure 400 are damaged, causing the first light emitting diode 200 in the faulty pixel structure PX to fail to emit light normally. In FIG. 16A to FIG. 19B, a cross mark is marked on the first light emitting diode 200 that cannot emit light normally.

Figure 17A:
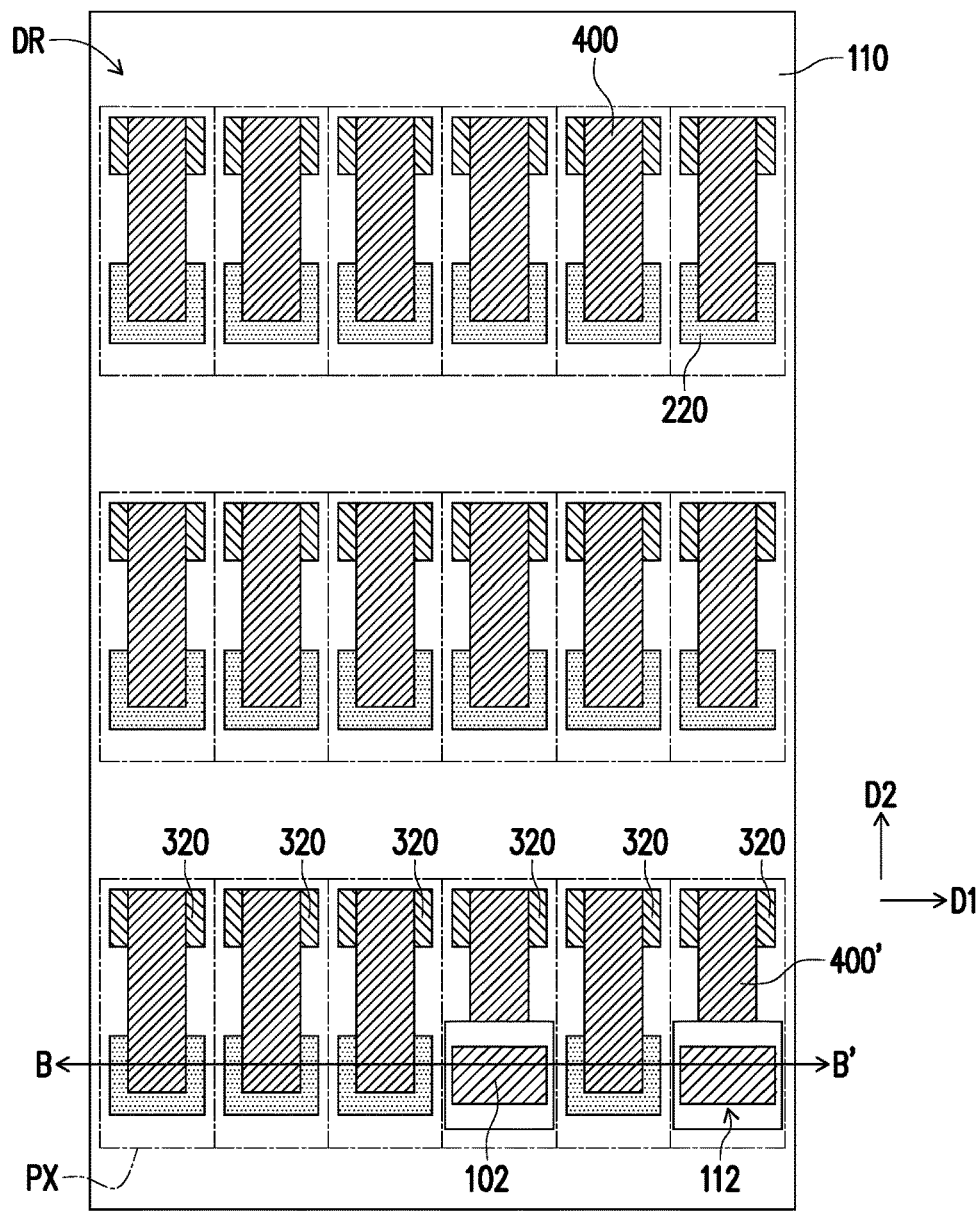
Figure 17B:
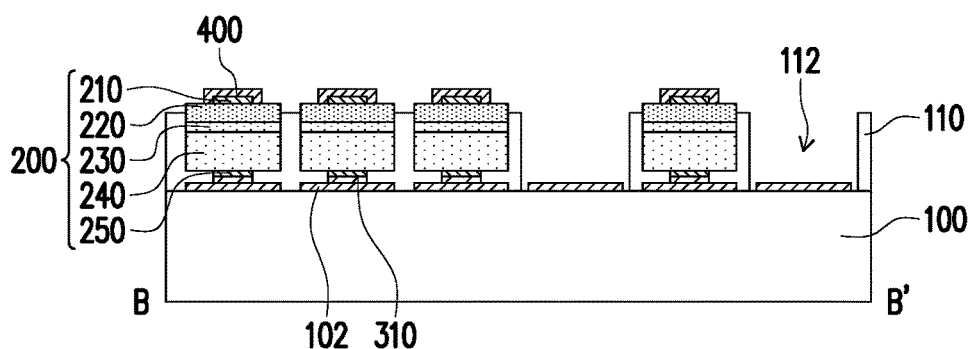

Referring to FIG. 17A and FIG. 17B, a portion of the molding layer 110 is removed to form an opening 112 exposing at least a portion of the first pad structure 102. In this embodiment, at least one faulty first light emitting diode 200 is located in the removed portion of the molding layer 110, and the faulty first light emitting diode 200 is removed, so that at least a portion of the first pad structure 102 under the faulty first light emitting diode 200 is exposed.

In some embodiments, the removing method for a portion of the molding layer 110 includes a dry etching process (e.g., a laser process) or a wet etching process. In some embodiments, the removing method of the faulty first light emitting diode 200 includes a laser (e.g., ultraviolet laser or infrared laser) process, vacuum extraction, or other suitable methods.

In this embodiment, a portion of the first conductive connection structure 400 is also removed to form the first conductive connection structure 400'. For example, at least a portion of the first conductive connection structure 400 on the first light emitting diode 200 in the faulty pixel structure PX is removed. The size of the first conductive connection structure 400' in the faulty pixel structure PX is smaller than the size of the first conductive connection structure 400 in the non-faulty pixel structure PX.

Referring to FIG. 18A and FIG. 18B, the first light emitting diode 200' for repairing is disposed in the opening 112. The first light emitting diode 200' is bonded to at least a portion of the first pad structure 102.

The first light emitting diode 200' is a vertical light emitting diode and includes a first electrode 210', a first semiconductor layer 220', a light emitting layer 230', a second semiconductor layer 240', and a second electrode 250'. The first semiconductor layer 220', the light emitting layer 230', and the second semiconductor layer 240' are stacked in sequence. In some embodiments, one of the first semiconductor layer 220' and the second semiconductor layer 240' is an N-type semiconductor, and the other is a P-type semiconductor. The first electrode 210' and the second electrode 250' are respectively connected to the first semiconductor layer 220' and the second semiconductor layer 240'. In some embodiments, the first light emitting diode 200' includes light emitting diodes of different colors. For example, the first light emitting diode 200' includes red light emitting diodes, green light emitting diodes, blue light emitting diodes, or light emitting diodes of other colors. In some embodiments, the first light emitting diode 200' used for repairing the faulty pixel structure PX and the original first light emitting diode 200 in the pixel structure PX are light emitting diodes of the same color.

In some embodiments, after the first light emitting diode 200' is disposed in the opening 112, a filling material 120 is formed to fill the gap between the first light emitting diode 200' and the opening 112. The first light emitting diode 200' and the filling material 120 are filled into the opening 112, and the filling material 120 surrounds the first light emitting diode 200'. In some embodiments, the forming method of the filling material 120 includes inkjet printing, glue dispensing, or other suitable processes. In some embodiments, the filling material 120 includes epoxy resin, silicone, acrylic or other suitable materials, and the filling material 120 selectively includes carbon black, scattering particles, or other filling particles. The filling material 120 and the molding layer 110 may include the same or different materials.

Referring to FIG. 19A and FIG. 19B, a second conductive connection structure 500 is formed on the molding layer 110. The second conductive connection structure 500 electrically connects the first light emitting diode 200' to a corresponding one of the conductive blocks, and so far the display panel 20' including the repaired pixel structure PX' is formed.

Each of the repaired pixel structures PX' includes the first light emitting diode 200', the first conductive block 320, the first conductive connection structure 400', the filling material 120, and the second conductive connection structure 500. The first light emitting diode 200' is disposed on the first pad structure 102. The first conductive block 320 is disposed on the second pad structure 104. The first conductive connection structure 400' and the second conductive connection structure 500 are located on the molding layer 110. The second conductive connection structure 500 and the first conductive connection structure 400' electrically connect the first light emitting diode 200' to the first conductive block 320.

In this embodiment, since the conductive connection structure 500 is formed on the molding layer 110, and may be electrically connected to the second pad structure 104 through the first conductive block 320, therefore, it is possible to prevent disconnection of the conductive connection structure 500 caused by the step difference between the first electrode 210' of the first light emitting diode 200' and the second pad structure 104 and improve the yield of the maintenance process.

FIG. 20 is a top schematic view of a display panel according to an embodiment of the disclosure. It is noted that the embodiment of FIG. 20 uses the reference numerals and a part of the contents of the embodiment of FIG. 1A to FIG. 9B, and the same or similar reference numerals are used to denote the same or similar elements, and the description of the same technical content is omitted. For the description of the omitted portion, reference may be made to the foregoing embodiment, and details are not described herein.

The difference between the display panel 30 in FIG. 20 and the display panel 10' in FIG. 9B is that: in the display panel 30, the first conductive connection structure 400 and the second conductive connection structure 500 do not overlap at least a portion of the top surface of the first electrode 210 of the first light emitting diode 200 and at least a portion of the top surface of the first electrode 210R of the second light emitting diode 200R.

Referring to FIG. 20, in this embodiment, both the first conductive connection structure 400 and the second conductive connection structure 500 include a metal material, which is formed through a chemical vapor deposition process. In order to reduce the area covered by the first conductive connection structure 400 and the second conductive connection structure 500, the first conductive connection structure 400 is connected to the side surface of the first electrode 210 of the first light emitting diode 200 and exposes at least a portion of the top surface of the first electrode 210, and the second conductive connection structure 500 is connected to the side surface of the first electrode 210R of the second light emitting diode 200R and exposes at least a portion of the top surface of the first electrode 210R.

In this embodiment, it is taken as an example that both the first conductive connection structure 400 and the second conductive connection structure 500 include opaque conductive materials, but the disclosure is not limited thereto. In other embodiments, the first conductive connection structure 400 includes a transparent conductive material, and the second conductive connection structure 500 includes an opaque conductive material. In this case, even if the first conductive connection structure 400 covers the top surface of the first electrode 210 of the first light emitting diode 200, it does not have a great impact on the brightness of the display panel 30.

Figure 21:
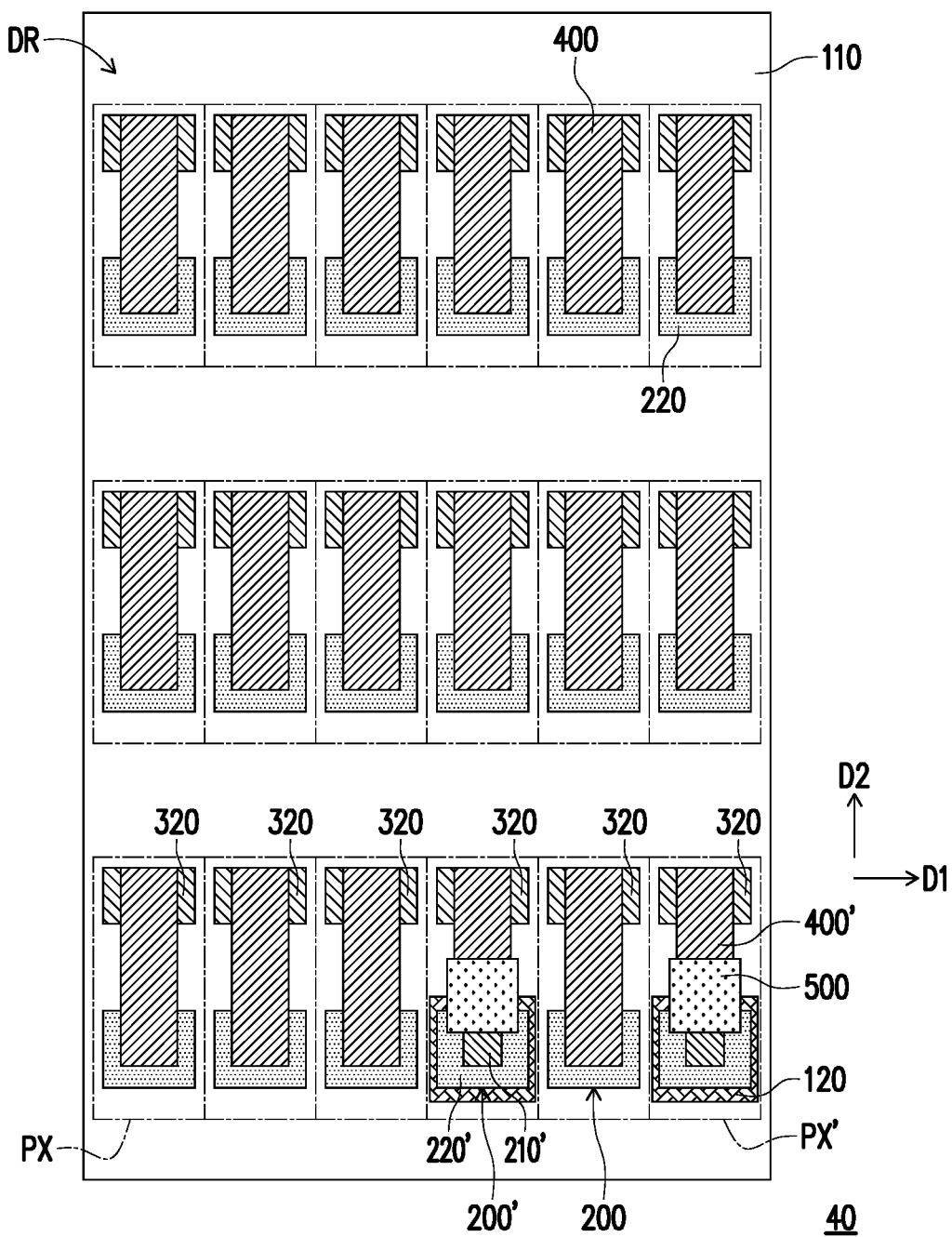
FIG. 21 is a top schematic view of a display panel according to an embodiment of the disclosure.

FIG. 21 is a top schematic view of a display panel according to an embodiment of the disclosure. It is noted that the embodiment of FIG. 21 uses the reference numerals and a part of the contents of the embodiment of FIG. 10A to FIG. 19B, and the same or similar reference numerals are used to denote the same or similar elements, and the description of the same technical content is omitted. For the description of the omitted portion, reference may be made to the foregoing embodiment, and details are not described herein.

The difference between the display panel 40 in FIG. 21 and the display panel 20' in FIG. 19B is that: in the display panel 40, the second conductive connection structure 500 does not overlap at least a portion of the top surface of the first electrode 210' of the first light emitting diode 200'.

Referring to FIG. 21, in this embodiment, the first conductive connection structure 400 includes a transparent conductive material, and the second conductive connection structure 500 includes an opaque conductive material. Even if the first conductive connection structure 400 covers the top surface of the first electrode 210 of the first light emitting diode 200, it does not have a great impact on the brightness of the display panel 40.

In this embodiment, the second conductive connection structure 500 includes a metal material and is formed through a chemical vapor deposition process. In order to reduce the area covered by the second conductive connection structure 500, the second conductive connection structure 500 is connected to the side surface of the first electrode 210' of the first light emitting diode 200' and exposes the top surface of the first electrode 210'.

To sum up, through the disposition of the molding layer and the conductive block, the problem of poor electrical connection between the light emitting diode and the pad due to the step difference may be improved.

What is claimed is:

1. A display panel, comprising:
a circuit substrate having a plurality of first pad structures and a plurality of second pad structures;
a plurality of pixel structures disposed within a display region of the circuit substrate, and each of at least a portion of the plurality of pixel structures comprising:
a first light emitting diode disposed on a corresponding first pad structure among the plurality of first pad structures;
a first conductive block disposed on a corresponding second pad structure among the plurality of second pad structures; and
a first conductive connection structure electrically connecting the first light emitting diode to the first conductive block; and
a molding layer located above the circuit substrate and surrounding the first light emitting diode and the first conductive block, wherein the first conductive connection structure is located on the molding layer.

2. The display panel according to claim 1, wherein one of the plurality of pixel structures is a repaired pixel structure, and the repaired pixel structure further comprises a second light emitting diode and a second conductive block, the second light emitting diode and the second conductive block are respectively disposed on the corresponding first pad structure and the corresponding second pad structure, and the repaired pixel structure further comprises:
a second conductive connection structure, electrically connecting the second light emitting diode to the second conductive block, wherein the second conductive connection structure is located on the molding layer.

3. The display panel according to claim 2, wherein in the repaired pixel structure, the first light emitting diode and the second light emitting diode are respectively located on a first portion and a second portion of the corresponding first pad structure, wherein the first portion and the second portion are structurally separated from each other.

4. The display panel according to claim 2, wherein in the repaired pixel structure, the first conductive block and the second conductive block are respectively disposed on a third portion and a fourth portion of the corresponding second pad structure, wherein the third portion and the fourth portion are structurally separated from each other.

5. The display panel according to claim 2, further comprising:
a filling material, wherein the second light emitting diode and the filling material are filled into an opening of the molding layer, and the filling material surrounds the second light emitting diode.

6. The display panel according to claim 2, wherein the second conductive connection structure electrically connects a first electrode of the second light emitting diode to the first conductive connection structure, wherein a horizontal distance between the second light emitting diode and the first conductive connection structure is smaller than a horizontal distance between the second light emitting diode and the second conductive block.

7. The display panel according to claim 2, wherein the second conductive connection structure is connected to a side surface of an electrode of the second light emitting diode, and the second conductive connection structure does not overlap at least a portion of the top surface of the electrode of the second light emitting diode.

8. The display panel according to claim 1, wherein the first conductive connection structure is connected to a side surface of an electrode of the first light emitting diode, and the first conductive connection structure does not overlap at least a portion of the top surface of the electrode of the first light emitting diode.

9. The display panel according to claim 1, wherein taking the circuit substrate as a basis, a height of a top surface of the molding layer is higher than a height of a light emitting layer of the first light emitting diode.

10. The display panel according to claim 2, wherein the first conductive connection structure and the second conductive connection structure comprise different materials.

11. The display panel according to claim 1, wherein the molding layer comprises transparent material, gray material, or black material.

12. The display panel according to claim 1, wherein each of the at least a portion of the plurality of pixel structures further comprises a second conductive block, the second conductive block is disposed on the corresponding second pad structure, and the first conductive connection structure is connected to the first conductive block and the second conductive block simultaneously.

13. The display panel according to claim 1, wherein a thickness of the first conductive block is 5 microns to 10 microns.

14. The display panel according to claim 1, wherein one of the at least a portion of the plurality of pixel structures is a repaired pixel structure, and the repaired pixel structure further comprises:
- a second conductive connection structure, electrically connected to the first light emitting diode and the first conductive block, wherein the second conductive connection structure is located on the molding layer.

* * * * *